United States Patent
Bills et al.

(10) Patent No.: US 10,712,446 B1
(45) Date of Patent: Jul. 14, 2020

(54) REMOTE SENSING FOR DETECTION AND RANGING OF OBJECTS

(71) Applicant: Apple Inc., Cupertino, CA (US)

(72) Inventors: Richard E. Bills, San Jose, CA (US); Micah P. Kalscheur, San Francisco, CA (US); Evan Cull, Sunnyvale, CA (US); Ryan A. Gibbs, Valencia, CA (US)

(73) Assignee: Apple Inc., Cupertino, CA (US)

( * ) Notice: Subject to any disclaimer, the term of this patent is extended or adjusted under 35 U.S.C. 154(b) by 327 days.

(21) Appl. No.: 15/271,810

(22) Filed: Sep. 21, 2016

Related U.S. Application Data

(60) Provisional application No. 62/233,224, filed on Sep. 25, 2015, provisional application No. 62/233,211, filed on Sep. 25, 2015.

(51) Int. Cl.
| | |
|---|---|
| *G01S 17/02* | (2006.01) |
| *G01S 17/86* | (2020.01) |
| *H04N 5/225* | (2006.01) |
| *G06T 7/00* | (2017.01) |
| *H04N 5/33* | (2006.01) |
| *H01S 5/183* | (2006.01) |
| *G01S 17/10* | (2020.01) |
| *G01S 7/4861* | (2020.01) |

(52) U.S. Cl.
CPC ............ *G01S 17/86* (2020.01); *G01S 7/4861* (2013.01); *G01S 17/10* (2013.01); *G06T 7/004* (2013.01); *G06T 7/0081* (2013.01); *H01S 5/183* (2013.01); *H04N 5/2256* (2013.01); *H04N 5/33* (2013.01)

(58) Field of Classification Search
CPC ...... G01S 17/023; G01S 7/4861; G01S 17/10; H01S 5/183; H04N 5/33; H04N 5/2256
See application file for complete search history.

(56) References Cited

U.S. PATENT DOCUMENTS

| | | | |
|---|---|---|---|
| 5,552,893 | A | 9/1996 | Akasu |
| 7,411,486 | B2 | 8/2008 | Gern et al. |
| 7,961,301 | B2 | 6/2011 | Earhart et al. |
| 8,125,622 | B2 | 2/2012 | Gammenthaler |

(Continued)

OTHER PUBLICATIONS

U.S. Appl. No. 15/271,791, filed Sep. 21, 2016, Bills et al.

(Continued)

*Primary Examiner* — Tat C Chio
(74) *Attorney, Agent, or Firm* — Polsinelli PC

(57) ABSTRACT

Aspects of the present disclosure involve example systems and methods for remote sensing of objects. In one example, a system includes a light source, a camera, a light source timing circuit, an exposure window timing circuit, and a range determination circuit. The light source timing circuit is to generate light pulses using the light source. The exposure window timing circuit generates multiple exposure windows for the light pulses for the camera, each of the multiple exposure windows representing a corresponding first range of distance from the camera. The range determination circuit processes an indication of an amount of light captured at the camera during an opening of each of the multiple exposure windows for one of the light pulses to determine a presence of an object within a second range of distance from the camera, the second range having a lower uncertainty than the first range.

22 Claims, 19 Drawing Sheets

(56) References Cited

U.S. PATENT DOCUMENTS

| | | | |
|---|---|---|---|
| 2011/0026008 A1* | 2/2011 | Gammenthaler | G01S 17/023 356/28 |
| 2012/0051588 A1 | 3/2012 | McEldowney | |
| 2014/0350836 A1* | 11/2014 | Stettner | G01S 17/023 701/301 |
| 2015/0146033 A1* | 5/2015 | Yasugi | H04N 5/353 348/222.1 |
| 2015/0369565 A1 | 12/2015 | Kepler | |
| 2016/0047900 A1 | 2/2016 | Dussan | |
| 2016/0061655 A1 | 3/2016 | Nozawa | |
| 2016/0360074 A1 | 12/2016 | Winer et al. | |
| 2016/0363654 A1 | 12/2016 | Wyland | |
| 2017/0219693 A1* | 8/2017 | Choiniere | G01S 7/484 |
| 2018/0121724 A1* | 5/2018 | Ovsiannikov | G06K 9/00604 |

OTHER PUBLICATIONS

U.S. Appl. No. 15/712,762, filed Sep. 22, 2017, Bills et al.
Night Vision, Mercedes, http://www.autolivnightvision.com/vehicles/mercedes/, accessed Oct. 12, 2017, 2 pages.
BrightWay Vision, Technology Overview, https://www.brightwayvision.com/technology/#technology-overview, accessed Oct. 12, 2017, 5 pages.
High Definition Lidar Sensor HDL-64E User's Manual, Velodyne, www.velodynelidar.com/lidar/products/manual/HDL-64E%20Manual.pdf, accessed Oct. 12, 2017, 21 pages.
Ulrich, "Infrared Car System Spots Wildlife on the Road From 500 Feet Away," Popular Science, Aug. 29, 2013, https://www.popsci.com/technology/article/2013-08/infrared-car-system-spots-wildlife, access Oct. 12, 2017, 2 pages.
"Application Analysis of Near-Infrared Illuminators Using Diode Laser Light Sources," White Paper, Electrophysics Resource Center: Night Vision, 2007, 12 pages.
"Night View: Detects objects and pedestrians during the nighttime," Toyota Global Site, Technology File, http://www.toyota-global.com/innovation/safety_technology/safety_technology/technology_file/active/night_view.html, access Oct. 12, 2017, 2 pages.
Night Vision—seeing is believing, Autoliv, https://www.autoliv.com/ProductsAndInnovations/ActiveSafetySystems/Pages/NightVisionSystems.aspx, accessed Oct. 12, 2017, 2 pages.

* cited by examiner

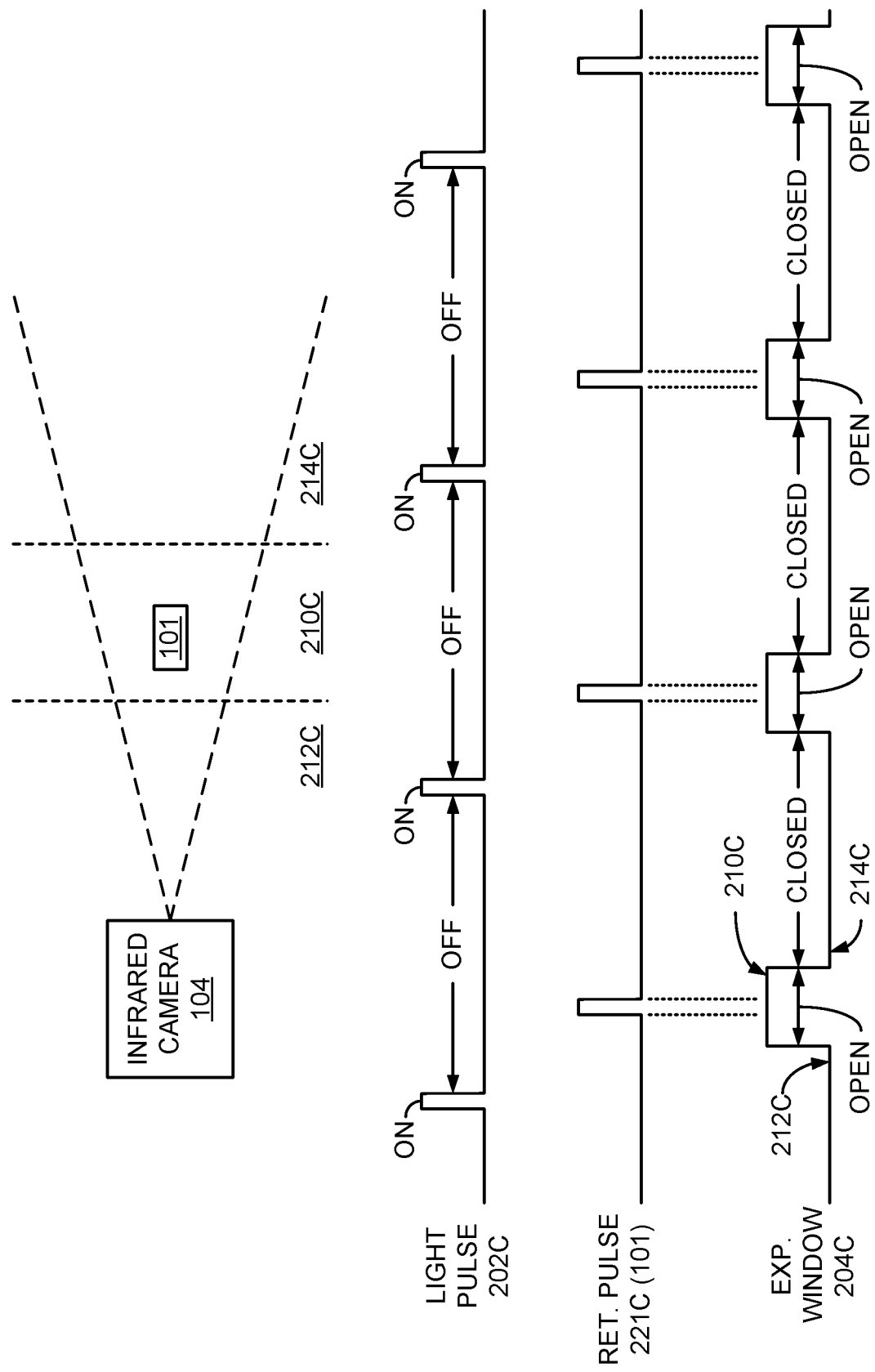

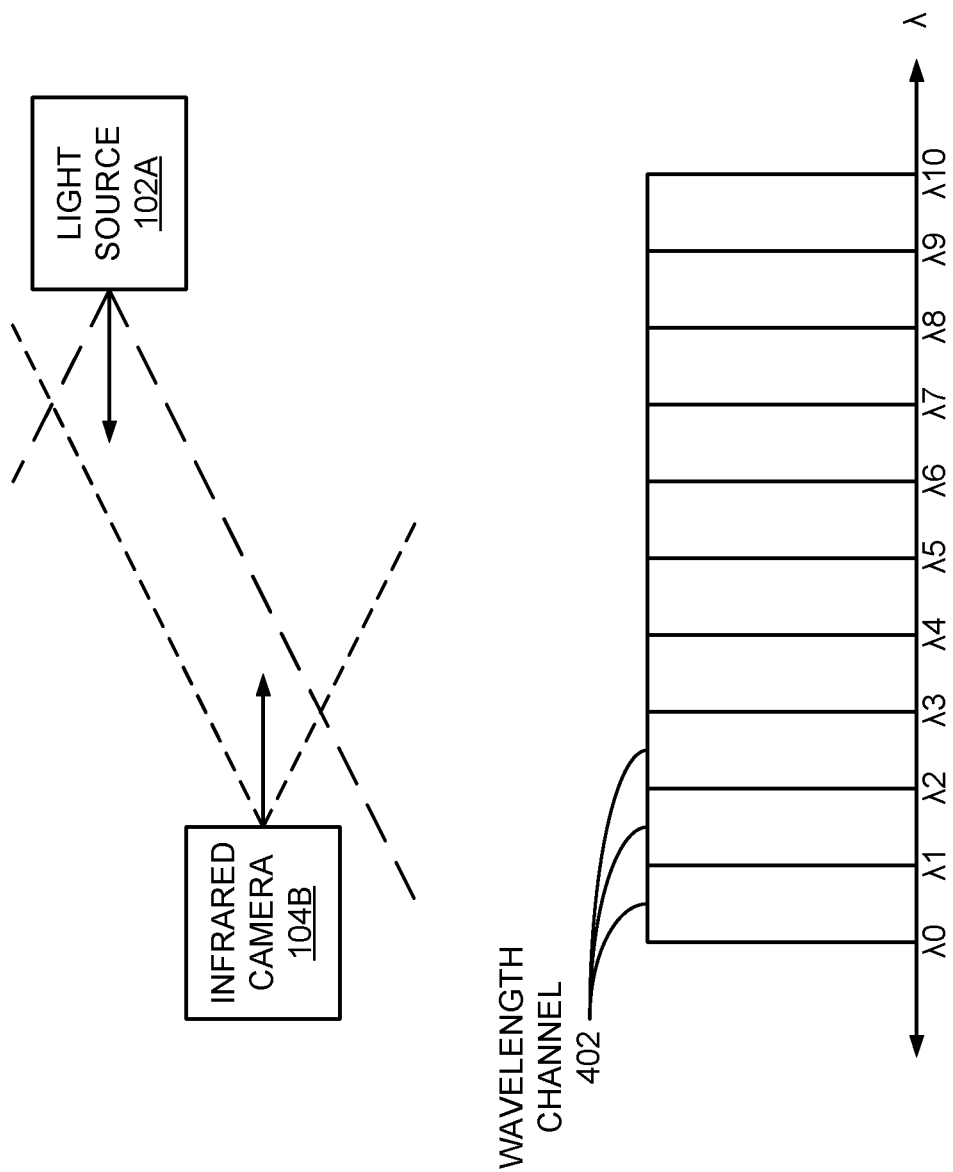

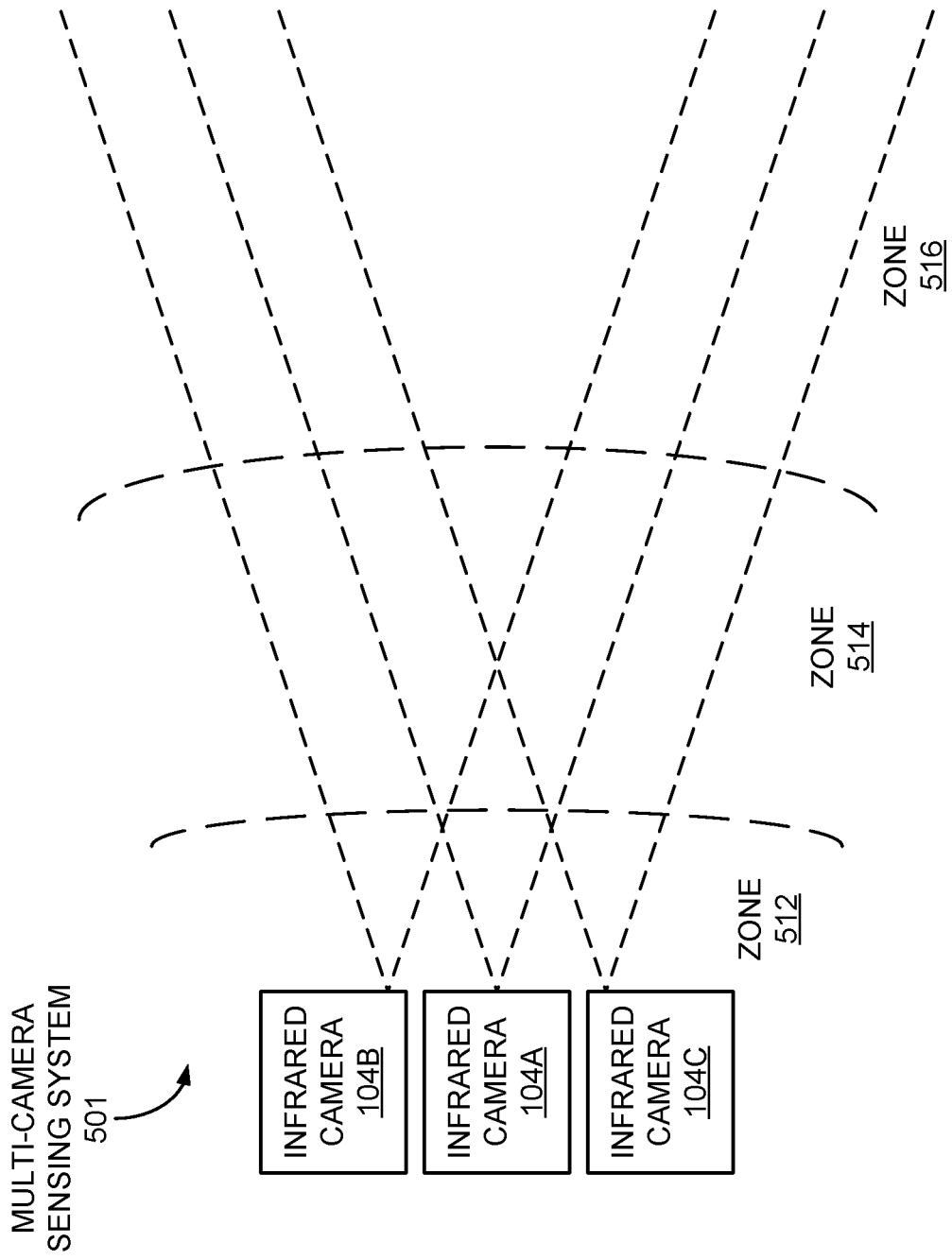

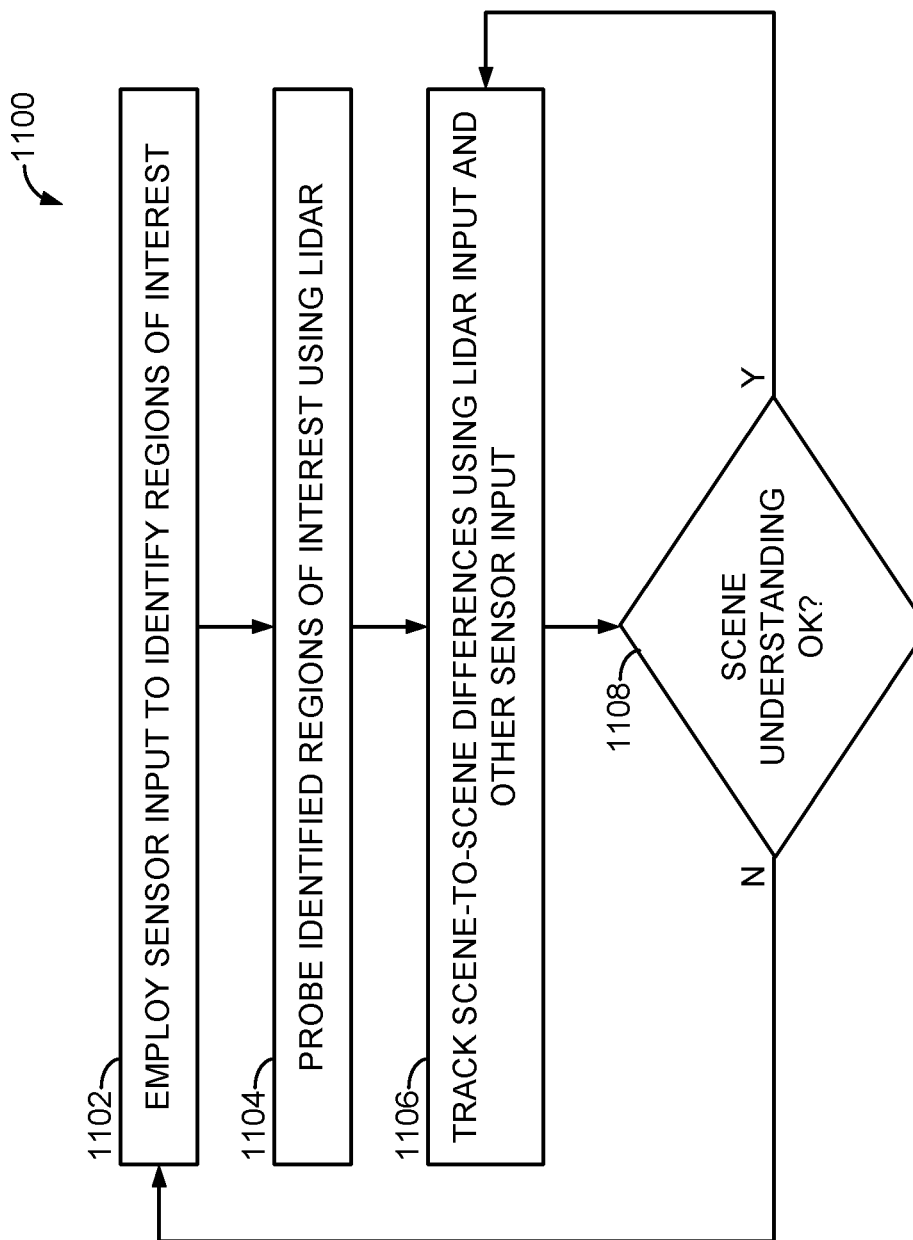

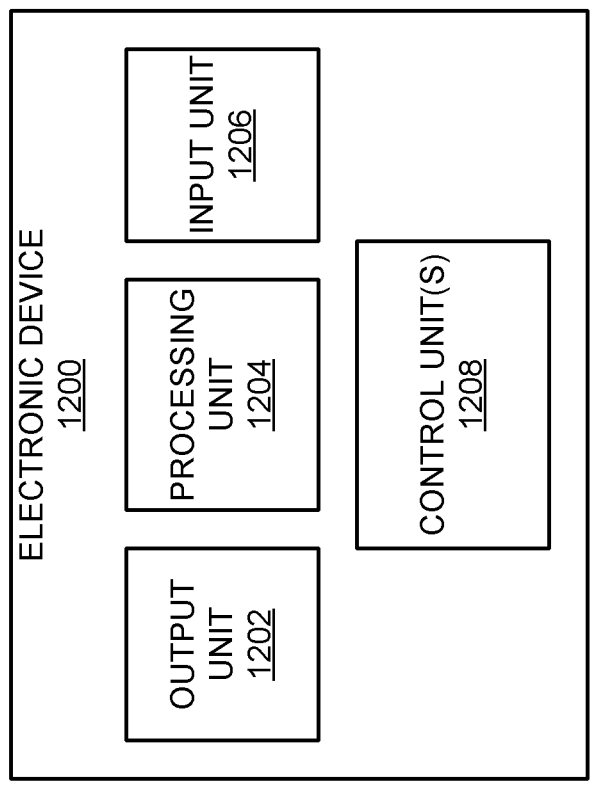

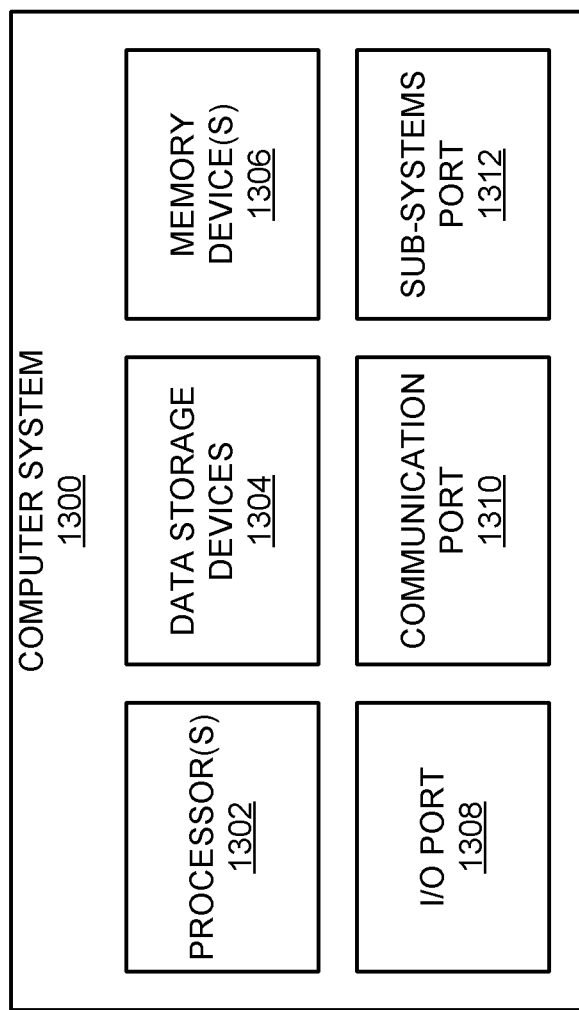

REMOTE SENSING FOR DETECTION AND RANGING OF OBJECTS

CROSS-REFERENCE TO RELATED APPLICATIONS

This application is related to and claims priority under 35 U.S.C. § 119(e) to U.S. Patent Application No. 62/233,224, filed Sep. 25, 2015, entitled "Remote Sensing for Detection and Ranging of Objects" and U.S. Patent Application No. 62/233,211, filed Sep. 25, 2015, entitled "Remote Sensing for Detection and Ranging of Objects," both of which are hereby incorporated by reference in their entirety.

TECHNICAL FIELD

This disclosure relates generally to remote sensing systems, and more specifically to remote sensing for the detection and ranging of objects.

BACKGROUND

Remote sensing, in which data regarding an object is acquired using sensing devices not in physical contact with the object, has been applied in many different contexts, such as, for example, satellite imaging of planetary surfaces, geological imaging of subsurface features, weather forecasting, and medical imaging of the human anatomy. Remote sensing may thus be accomplished using a variety of technologies, depending on the object to be sensed, the type of data to be acquired, the environment in which the object is located, and other factors.

One remote sensing application of more recent interest is terrestrial vehicle navigation. While automobiles have employed different types of remote sensing systems to detect obstacles and the like for years, sensing systems capable of facilitating more complicated functionality, such as autonomous vehicle control, remain elusive.

SUMMARY

According to one embodiment, a system for sensing objects includes a light source, a camera, a light source timing circuit to generate light pulses using the light source, an exposure window timing circuit to generate multiple exposure windows for the light pulses for the camera, each of the multiple exposure windows representing a corresponding first range of distance from the camera, and a range determination circuit to process an indication of an amount of light captured at the camera during an opening of each of the multiple exposure windows for one of the light pulses to determine a presence of an object within a second range of distance from the camera, the second range having a lower uncertainty than the first range.

According to another embodiment, a system for sensing objects includes a light source, a camera, a light source timing circuit to generate light pulses using the light source, an exposure window timing circuit to generate an exposure window for each light pulse for the camera, the exposure window representing a corresponding range of distance from the camera, and a range determination circuit to process an indication of an amount of light captured at the camera during an opening of the exposure window for one of the light pulses to determine a presence of an object within the range of distance from the camera, wherein the light source timing circuit dynamically alters a characteristic of the generated light pulses over time.

In an additional embodiment, a method for sensing objects includes generating, by a processor, light pulses using a light source, generating, by the processor, multiple exposure windows for the light pulses for a camera, each of the multiple exposure windows representing a corresponding first range of distance from the camera, and processing, by the processor, an indication of an amount of light captured at the camera during an opening of each of the multiple exposure windows for one of the light pulses to determine a presence of an object within a second range of distance from the camera, the second range having a lower uncertainty than the first range.

These and other aspects, features, and benefits of the present disclosure will become apparent from the following detailed written description of the preferred embodiments and aspects taken in conjunction with the following drawings, although variations and modifications thereto may be effected without departing from the spirit and scope of the novel concepts of the disclosure.

BRIEF DESCRIPTION OF THE DRAWINGS

FIG. 2C is a timing diagram of a light pulse generated by a light source and an exposure window for the infrared camera of FIG. 1 for longer-range detection of objects.

FIG. 4 is a graph of multiple wavelength channels for the light source of FIG. 1 to facilitate wavelength diversity to mitigate intersystem interference.

FIG. 5B is a block diagram of an example multiple-camera system to facilitate multiple depth zones for the same field of view.

FIG. 11 is a flow diagram of an example method of operating a vehicle autonomy system.

FIG. 12 is a functional block diagram of an electronic device including operational units arranged to perform various operations of the presently disclosed technology.

FIG. 13 is an example computing system that may implement various systems and methods of the presently disclosed technology.

DETAILED DESCRIPTION

Aspects of the present disclosure involve systems and methods for remote sensing of objects. In at least some embodiments, remote sensing is performed using a camera (e.g., an infrared camera) and associated light source, wherein an exposure window for the camera is timed relative to pulsing of the light source to enhance the ranging information yielded. In some examples, the cameras may be employed in conjunction with light radar (lidar) systems to identify regions of interest that, when coupled with the enhanced ranging information (e.g., range-gated information), may be probed using the lidar systems to further improve the ranging information.

The various embodiments described herein may be employed in an autonomous vehicle, possibly in connection with other sensing devices, to facilitate control of acceleration, braking, steering, navigation, and other functions of the vehicle in various challenging environmental conditions during the day or at night.

Figure 1:
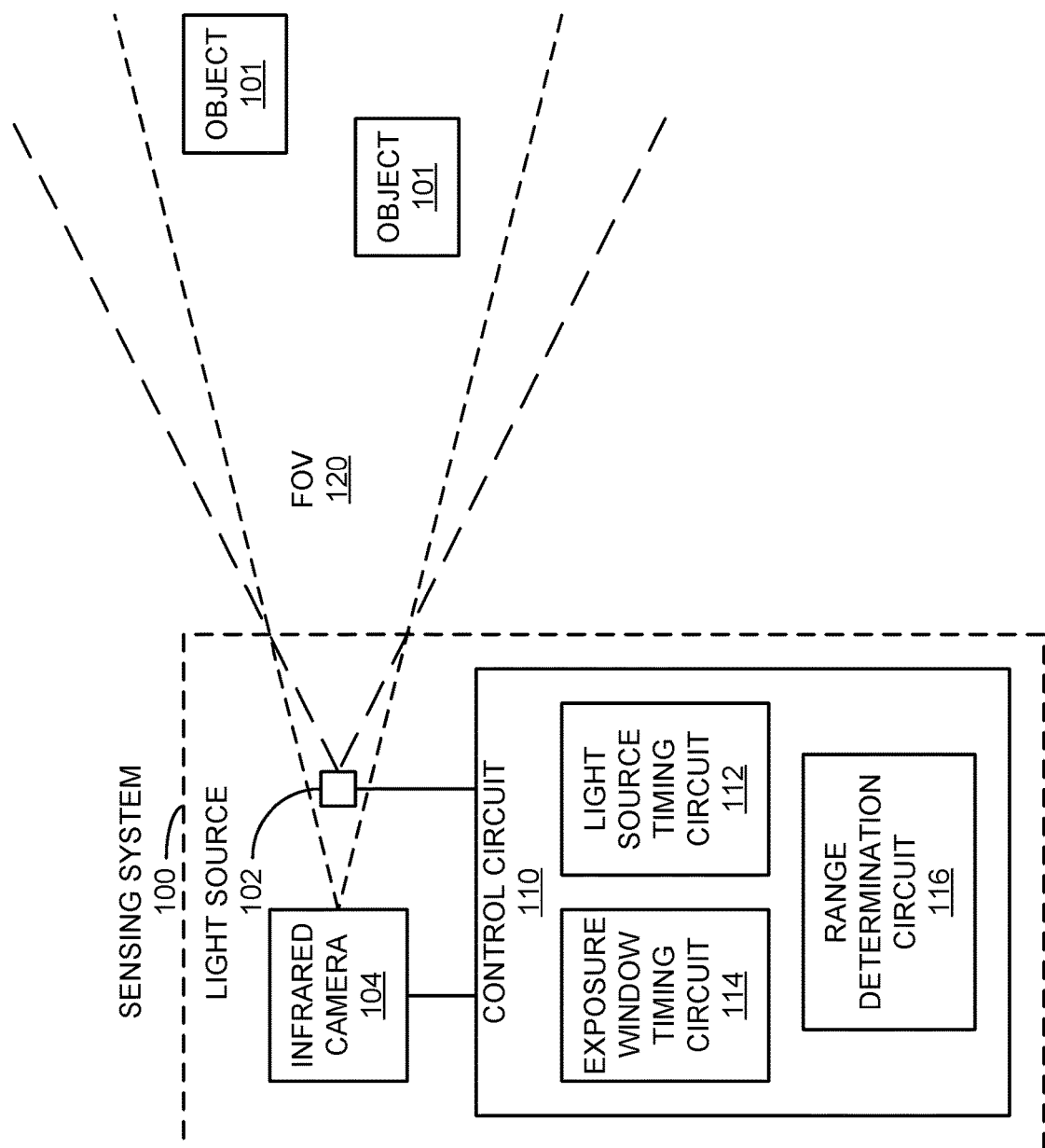
FIG. 1 is a block diagram of an example sensing system including an infrared camera operating in conjunction with a controllable light source.

FIG. 1 is a block diagram of an example sensing system 100 that includes an imaging device, such as an infrared camera 104, operating in conjunction with a controllable light source 102 for sensing an object 101. In other examples, cameras and associated light sources employing wavelength ranges other than those in the infrared range may be similarly employed in the manner described herein. In one example, a control circuit 110 may control both the infrared camera 104 and the light source 102 to obtain ranging or distance information of the object 101. In the embodiment of FIG. 1, the control circuit 110 may include a light source timing circuit 112, an exposure window timing circuit 114, and a range determination circuit 116. Each of the control circuit 110, the light source timing circuit 112, the exposure window timing circuit 114, and the range determination circuit 116 may be implemented as hardware and/or software modules. Other components or devices not explicitly depicted in the sensing system 100 may also be included in other examples.

The light source 102, in one embodiment, may be an infrared light source. More specifically, the light source may be a near-infrared (NIR) light source, such as, for example, a vertical-cavity surface-emitting laser (VCSEL) array or cluster, although other types of light sources may be utilized in other embodiments. Each of multiple such laser sources may be employed, each of which may be limited in output power (e.g., 2-4 watts (W) per cluster) and spaced greater than some minimum distance (e.g., 250 millimeters (mm)) apart to limit the amount of possible laser power being captured by the human eye. Such a light source 102 may produce light having a wavelength in the range of 800 to 900 nanometers (nm), although other wavelengths may be used in other embodiments. To operate the light source 102, the light source timing circuit 112 may generate signals to pulse the light source 102 according to a frequency and/or duty cycle, and may alter the timing of the pulses according to a condition, as described in the various examples presented below.

The infrared camera 104 of the sensing system 100 may capture images of the object within a field of view (FOV) 120 of the infrared camera 104. In some examples, the infrared camera 104 may be a near-infrared (NIR) camera. More specifically, the infrared camera 104 may be a high dynamic range NIR camera providing an array (e.g., a 2K×2K array) of imaging elements to provide significant spatial or lateral resolution (e.g., within an x, y plane facing the infrared camera 104). To operate the infrared camera 104, the exposure window timing circuit 114 may generate a signal to open and close an exposure window for the infrared camera 104 to capture infrared images illuminated at least in part by the light source 102. Examples of such timing signals are discussed more fully hereafter.

The range determination circuit 116 may receive the images generated by the infrared camera 104 and determine a range of distance from the infrared camera 104 to each object 101. For example, the range determination circuit 116 may generate both two-dimensional (2D) images as well as three-dimensional (3D) range images providing the range information for the objects. In at least some examples, the determined range (e.g., in a z direction orthogonal to an x, y plane) for a particular object 101 may be associated with a specific area of the FOV 120 of the infrared camera 104 in which the object 101 appears. As discussed in greater detail below, each of these areas may be considered a region of interest (ROI) to be probed in greater detail by other devices, such as, for example, a lidar system. More generally, the data generated by the range determination circuit 116 may then cue a lidar system to positions of objects and possibly other ROIs for further investigation, thus yielding images or corresponding information having increased spatial, ranging, and temporal resolution.

The control circuit 110, as well as other circuits described herein, may be implemented using dedicated digital and/or analog electronic circuitry. In some examples, the control circuit 110 may include microcontrollers, microprocessors, and/or digital signal processors (DSPs) configured to execute instructions associated with software modules stored in a memory device or system to perform the various operations described herein.

While the control circuit 110 is depicted in FIG. 1 as employing separate circuits 112, 114, and 116, such circuits may be combined at least partially. Moreover, the control circuit 110 may be combined with other control circuits described hereafter. Additionally, the control circuits disclosed herein may be apportioned or segmented in other ways not specifically depicted herein while retaining their functionality, and communication may occur between the various control circuits in order to perform the functions discussed herein.

FIGS. 2A through 2E are timing diagrams representing different timing relationships between pulses of the light source 102 and the opening and closing of exposure windows or gates for the infrared camera 104 for varying embodiments. Each of the timing diagrams within a particular figure, as well as across different figures, is not drawn to scale to highlight various aspects of the pulse and window timing in each case.

Figure 2A:
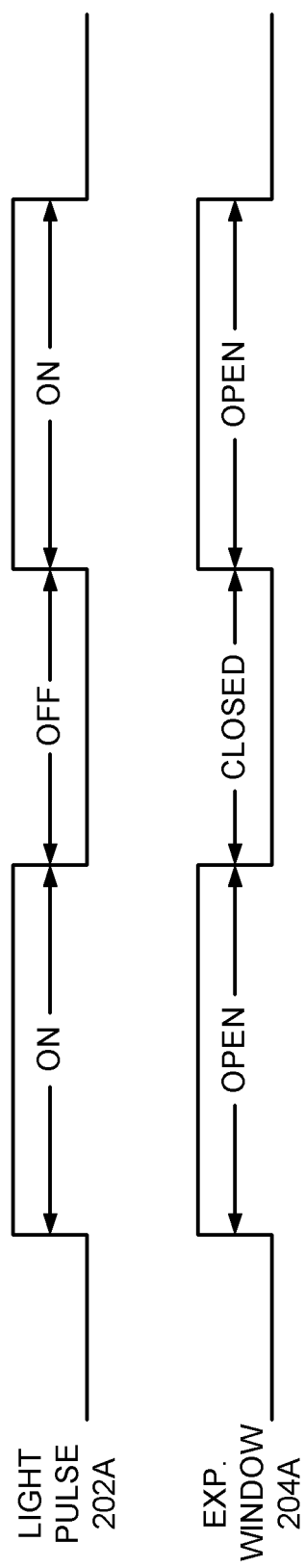
FIG. 2A is a timing diagram of a light pulse generated by a light source and an exposure window for the infrared camera of FIG. 1 for general scene illumination.

FIG. 2A is a timing diagram of a recurring light pulse 202A generated by the light source 102 under control of the light source timing circuit 112 and an exposure window 204A or gate for the infrared camera 104 under the control of the exposure window timing circuit 114 for general scene illumination to yield images during times when ranging information is not to be gathered, such as for capturing images of all objects and the surrounding environment with the FOV 120 of the infrared camera 104. In this operational mode, the light source 102 may be activated ("on") periodically for some relatively long period of time (e.g., 5 milliseconds (ms)) to illuminate all objects 101 within some range of the infrared camera 104 (which may include the maximum range of the infrared camera 104), and the exposure window 204A may be open during the times the light source 102 is activated. As a result, all objects 101 within the FOV 120 may reflect light back to the infrared camera 104 while the exposure window 204A is open. Such general scene illumination may be valuable for initially identifying or imaging the objects 101 and the surrounding environment at night, as well as during the day as a sort of "fill-in flash" mode, but would provide little-to-no ranging information for the objects 101. Additionally, pulsing the lights source 102 in such a manner, as opposed to leaving the light source 102 activated continuously, may result in a significant savings of system power.

Figure 2B:
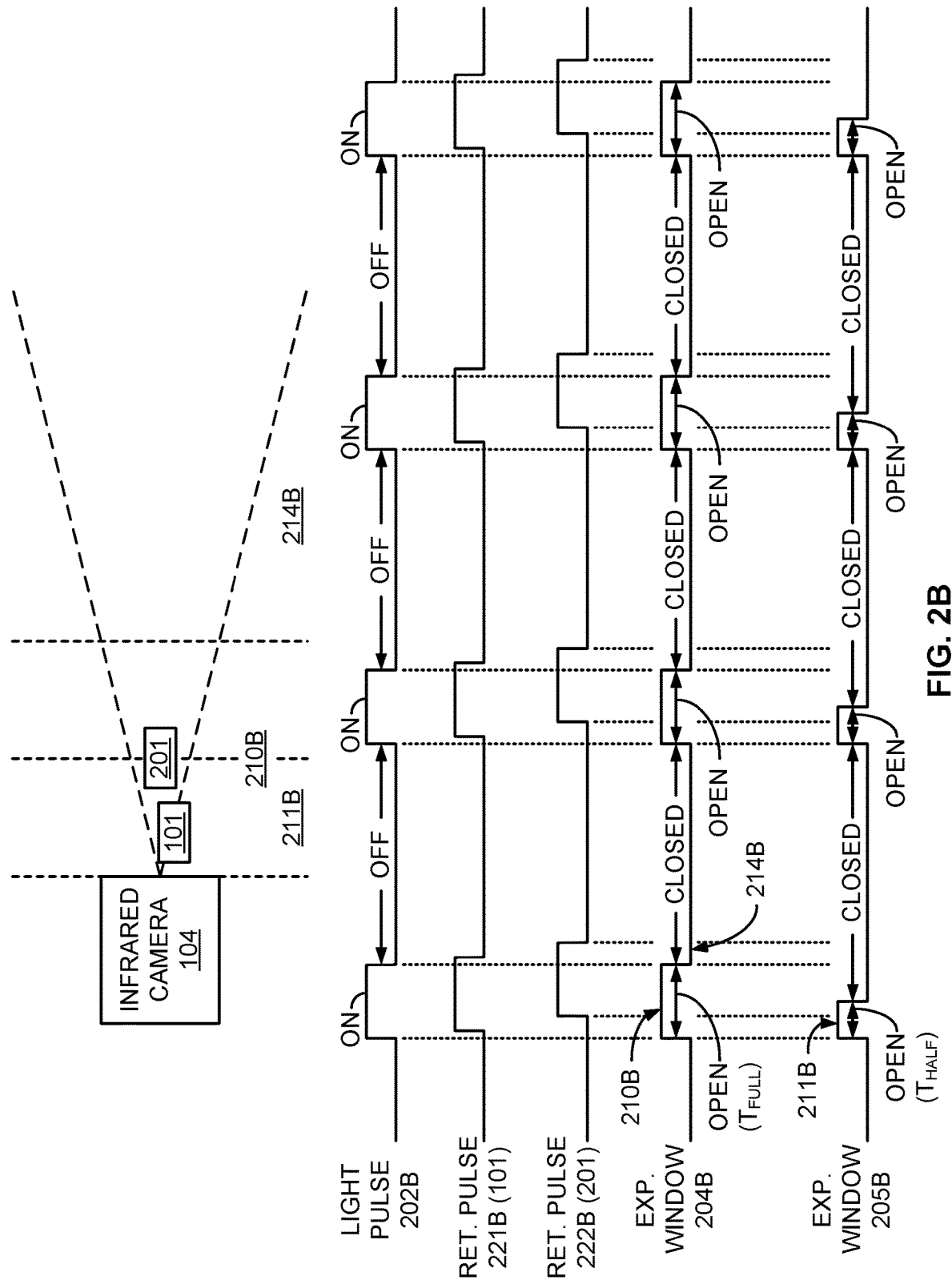
FIG. 2B is a timing diagram of a light pulse generated by a light source and multiple overlapping exposure windows for the infrared camera of FIG. 1 for close-range detection of objects.

FIG. 2B is a timing diagram of a recurring light pulse 202B and multiple overlapping exposure windows 204B for the infrared camera 104 for close-range detection and ranging of objects 101 and 201. In this example, each light pulse 202B is on for some limited period of time (e.g., 200 nanoseconds (ns), associated with a 30 meter (m) range of distance), and a first exposure window 204B is open through the same time period (TFULL) that the light pulse 202B is active, resulting in an associated outer range 210B within 30 m from the infrared camera 104. A second exposure window 205B is opened at the same time as the first exposure window 204B, but is then closed halfway through the time the light pulse 202B is on (THALF) and the first exposure window 204B is open, thus being associated with an inner range 211B within 15 m of the infrared camera 104. Images of objects beyond these ranges 210B and 211B (e.g., in far range 214B), will not be captured by the infrared camera 104 using the light pulse 202B and the exposure windows 204B and 205B. Accordingly, in this particular example, a returned light pulse 221B from object 101 of similar duration to the light pulse 202B, as shown in FIG. 2B, will be nearly fully captured during both exposure window 204B and 205B openings due to the close proximity of object 101 to the infrared camera 104, while a returned light pulse 222B from object 201 will be partially captured during both the first exposure window 204B opening and the second exposure window 205B opening to varying degrees based on the position of object 201 within the ranges 210B and 211B, but more distant from the infrared camera 104 than object 101.

Given the circumstances of FIG. 2B, the distance of the objects 101 and 201 may be determined if a weighted image difference based on the two exposure windows 204B and 205B is calculated. Since the light must travel from the light source 102 to each of the objects 101 and 201 and back again, twice the distance from the infrared camera 104 to the objects 101 and 201 (2($\Delta d$)) is equal to the time taken for the light to travel that distance ($\Delta t$) times the speed of light (c). Stated differently:

$$\Delta d = \frac{c}{2}(\Delta t)$$

Thus, for each of the objects 101 and 201 to remain within the inner range 211B:

$$0 \leq \Delta d \leq \frac{c}{2}(T_{HALF})$$

Presuming the rate at which the voltage or other response of an imaging element of the infrared camera 104 rises while light of a particular intensity is being captured (e.g., while the exposure window 204B or 205B is open), the range determination circuit 116 may calculate the time $\Delta t$ using the voltage associated with the first exposure window 204B (VFULL) and the voltage corresponding with the second exposure window 205B (VHALF):

$$\Delta t = (V_{FULL}T_{HALF} - V_{HALF}T_{FULL})/(V_{FULL} - V_{HALF})$$

The range determination circuit 116 may then calculate the distance $\Delta d$ from the infrared camera 104 to the object 101 or 201 using the relationship described above. If, instead, an object lies outside the inner range 211B but still within the outer range 210B, the range determination circuit 116 may be able to determine that the object lies somewhere inside the outer range 210B, but outside the inner range 211B.

FIG. 2C is a timing diagram of a recurring light pulse 202C generated by the light source 102 and an exposure window 204C for the infrared camera 104 for longer-range detection of objects. In this example, a short (e.g., 100 nsec) light pulse 202C corresponding to a 15 m pulse extent is generated, resulting in a returned light pulse 221C of similar duration for an object 101. As shown in FIG. 2C, each light pulse 202C is followed by a delayed opening of the exposure window 204C of a time period associated with a photon collection zone 210C in which the object 101 is located within the FOV 120 of the infrared camera 104. More specifically, the opening of the exposure window 204C corresponds with the edge of the photon collection zone 210C adjacent to a near-range blanking region 212C, while the closing of the exposure window 204C corresponds with the edge of the photon collection zone 210C adjacent to a far-range blanking region 214C. Consequently, use of the recurring light pulse 202C and associated exposure window 204C results in a range-gating system in which returned pulses 221C of objects 101 residing within the photon collection zone 210C are captured at the infrared camera 104. In one example, each exposure window 204C may be open for 500 nsec, resulting in a photon collection zone 210C of 75 m in depth. Further, a delay between the beginning of each light pulse 202C and the beginning of its associated opening of the exposure window 204C of 500 nsec may result in a near-range blanking region 212C of 75 m deep. Other depths for both the near-blanking region 212C and the photon collection zone 210C may be facilitated based on the delay and width, respectively, of the exposure window 204C opening in other embodiments. Further, while the light pulse 202C of FIG. 2C is of significantly shorter duration than the exposure window 204C, the opposite may be true in other embodiments.

Further, in at least some examples, the width or duration, along with the intensity, of each light pulse 202C may be controlled such that the light pulse 202C is of sufficient strength and length to allow detection of the object 101 within the photon collection zone 210C at the infrared camera 104 while being short enough to allow detection of the object 101 within the photon collection zone 210C within some desired level of precision.

In one example, a voltage resulting from the photons collected at the infrared camera 104 during a single open exposure window 204C may be read from each pixel of the infrared camera 104 to determine the presence of the object 101 within the photon collection zone 210C. In other embodiments, a voltage resulting from photons collected during multiple such exposure windows 204C, each after a corresponding light pulse 202C, may be read to determine the presence of an object 101 within the photon collection zone 210C. The use of multiple exposure windows 204C in such a manner may facilitate the use of a lower power light source 102 (e.g., a laser) than what may otherwise be possible. To implement such embodiments, light captured during the multiple exposure windows 204C may be integrated during photon collection on an imager integrated circuit (IC) of the infrared camera 104 using, for example, quantum well infrared photodetectors (QWIPs) by integrating the charge collected at quantum wells via a floating diffusion node. In other examples, multiple-window integration of the resulting voltages may occur in computing hardware after the photon collection phase.

Figure 2D:
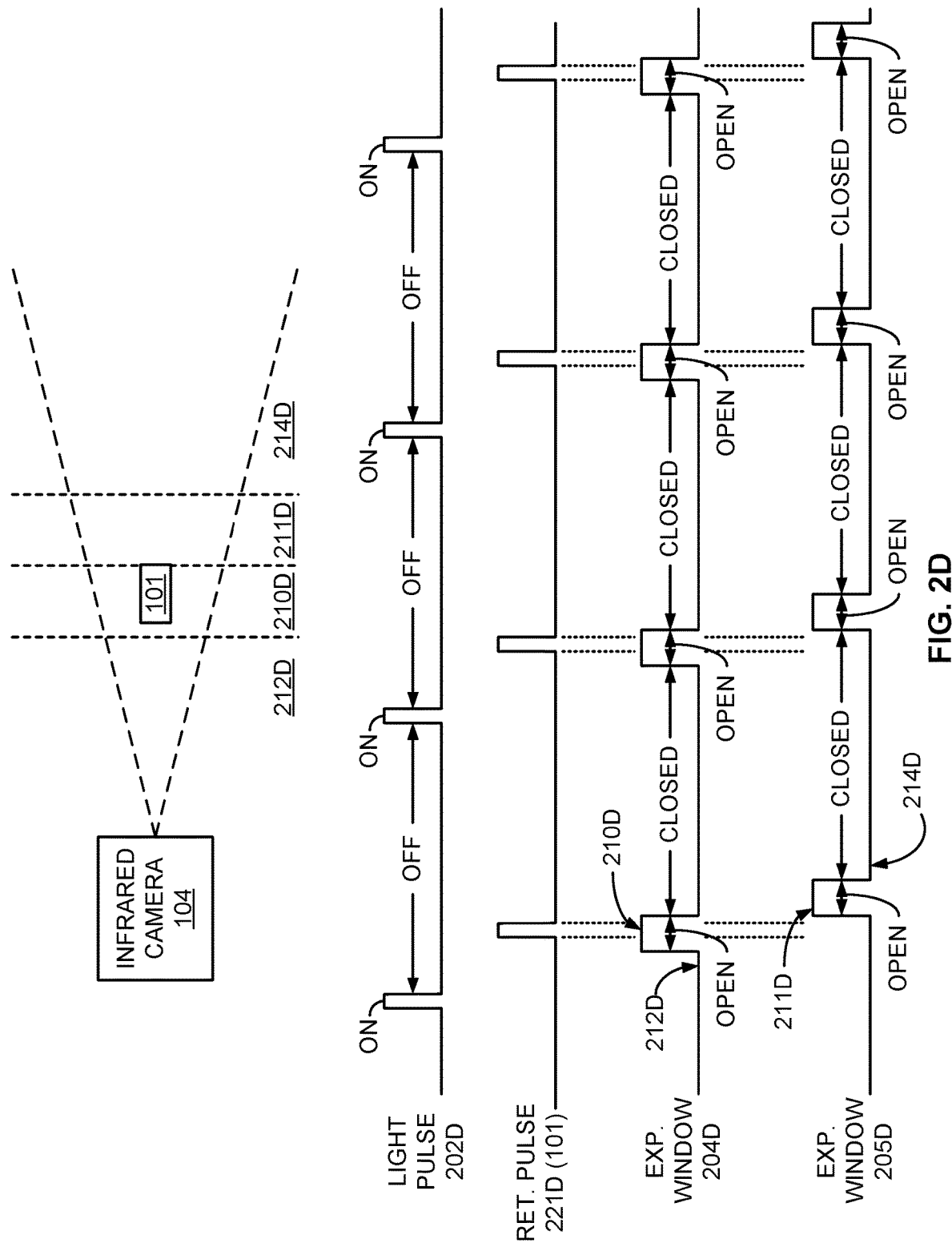
FIG. 2D is a timing diagram of a light pulse generated by a light source and multiple distinct exposure windows for the infrared camera of FIG. 1 for relatively fine resolution ranging of objects.

FIG. 2D is a timing diagram of a recurring light pulse 202D generated by the light source 102 and multiple distinct exposure windows 204D and 205D for the infrared camera 104 for relatively fine resolution ranging of objects. In this example, the openings of the two exposure windows 204D and 205D are adjacent to each other and non-overlapping to create adjacent photon collection zones 210D and 211D, respectively, located between a near-range blanking region 212D and a far-range blanking region 214D within the FOV 120 of the infrared camera 104. In a manner similar to that discussed above in conjunction with FIG. 2C, the location and width of each of the photon collection zones 210D and 211D may be set based on the width and delay of their corresponding exposure window 204D and 205D openings. In one example, each of the exposure window 204D and 205D openings may be 200 nsec, resulting in a depth of 30 m for each of the photon collection zones 210D and 211D. In one embodiment, the exposure window timing circuit 114 may generate the exposure windows 204D and 205D for the same infrared camera 104, while in another example, the exposure window timing circuit 114 may generate each of the exposure windows 204D and 205D for separate infrared cameras 104. In the particular example of FIG. 2D, an object 101 located in the first photon collection zone 210D and not the second collection zone 211D will result in returned light pulses 221D that are captured during the first exposure window 204D openings but not during the second exposure window 205D openings.

In yet other embodiments, the exposure window timing circuit 114 may generate three or more multiple exposure windows 204D and 205D to yield a corresponding number of photon collection zones 210D and 211D, which may be located between the near-range blanking region 212D and the far-range blanking region 214D. As indicated above, the multiple exposure windows 204D and 205D may correspond to infrared cameras 104.

In addition, while the exposure window 204D and 205D openings are of the same length or duration as shown in FIG. 2D, other embodiments may employ varying durations for such exposure window 204D and 205D openings. In one example, each opening of the exposure window 204D and 205D of increasing delay from its corresponding light pulse 202D may also be longer in duration, resulting in each photon collection region or zone 210D and 211D being progressively greater in depth the more distant that photon collection region 210D and 211D is from the infrared camera 104. Associating the distance and the depth of each photon collection region 210D and 211D in such a manner may help compensate for a loss of light reflected by an object 101, which is directly proportional to the inverse of the square of the distance between the light source 102 and the object 101. In some embodiments, the length of each photon collection region 210D and 211D may be proportional to, or otherwise related to, the inverse of the square of that distance.

Figure 2E:
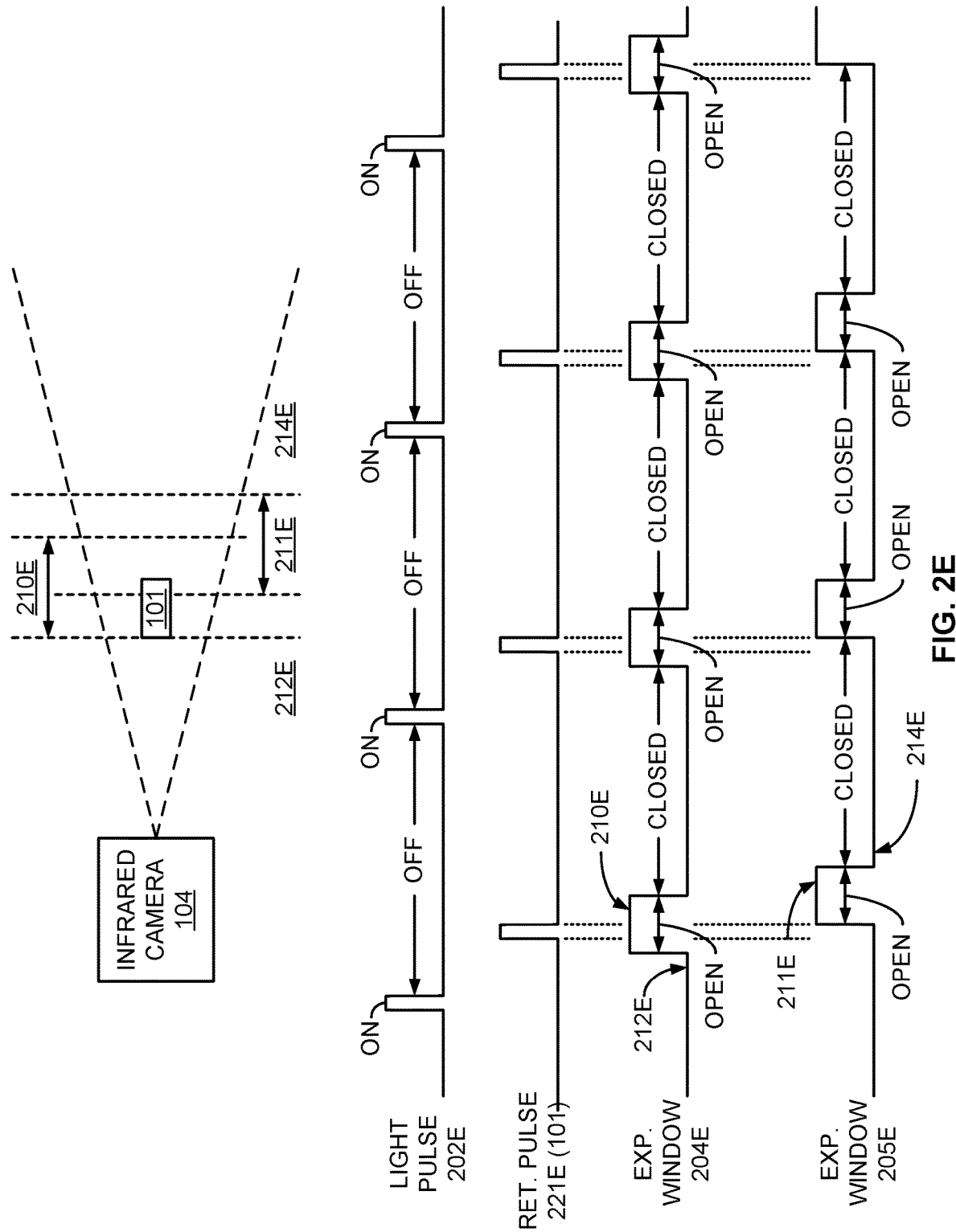
FIG. 2E is a timing diagram of a light pulse generated by a light source and multiple overlapping exposure windows for the infrared camera of FIG. 1 for fine resolution ranging of objects.

FIG. 2E is a timing diagram of a recurring light pulse 202E generated by a light source 102 and multiple overlapping exposure window 204E and 205E openings for the infrared camera 104 for fine resolution ranging of objects 101. In this example, the openings of the two exposure windows 204E and 205E overlap in time. In the particular example of FIG. 2E, the openings of the exposure windows 204E and 205E overlap by 50 percent, although other levels or degrees of overlap (e.g., 40 percent, 60 percent, 80 percent, and so on) may be utilized in other embodiments. These exposure windows 204E and 205E thus result in overlapping photon collection zones 210E and 211E, respectively, between a near-range blanking region 212E and a far-range blanking region 214E. Generally, the greater the amount of overlap of the exposure window 204E and 205E openings, the better the resulting depth resolution. For example, presuming a duration of each of the exposure windows 204E and 205E of 500 nsec, resulting in each of the photon collection zones 210E and 211E being 75 m deep, and presuming a 50 percent overlap of the openings of exposure windows 204E and 205E, a corresponding overlap of the photon collection zones 210E and 211E of 37.5 m is produced. Consequently, an effective depth resolution of 37.5 meters may be achieved using exposure windows 204E and 205E associated with photon collection zones 210E and 211E of twice that depth.

For example, in the specific scenario depicted in FIG. 2E, returned light pulses 221E reflected by an object 101 are detected by the infrared camera 104 using the first exposure window 204E, and are not detected using the second exposure window 205E, indicating that the object 101 is located within the first photon collection zone 210E but not the second photon collection zone 211E. If, instead, the returned light pulses 221E reflected by the object 101 are detected using the second exposure window 205E, and are not detected using the first exposure window 204E, the object 101 is located in the second photon collection zone 211E and not the first photon collection zone 210E. Further, if the returned light pulses 221E reflected by the object 101 are detected using the first exposure window 204E, and are also detected using the second exposure window 205E, the object 101 is located in the region in which the first photon collection zone 210E and the second photon collection zone 211E overlap. Accordingly, presuming a 50 percent overlap of the first exposure window 204E and the second exposure window 205E, the location of the object 101 may be determined within a half of the depth of the first photon collection zone 210E and of the second photon collection zone 211E.

To implement the overlapped exposure windows, separate infrared cameras 104 may be gated using separate ones of the first exposure window 204E and the second exposure window 205E to allow detection of the two photon collection zones 210E and 211E based on a single light pulse 202E. In other examples in which a single infrared camera 104 is employed for both the first exposure window 204E and the second exposure window 205E, the first exposure window 204E may be employed for light pulses 202E of a photon collection cycle, and the second exposure window 205E may be used following other light pulses 202E of a separate photon collection cycle. Thus, by tracking changes from one photon collection cycle to another while dynamically altering the delay of the exposure window 204E and 205E from the light pulses 202E, the location of objects 101 detected within one of the photon collection zones 210E and 211E may be determined as described above.

While the examples of FIG. 2E involve the use of two exposure windows 204E and 205E, the use of three or more exposure windows that overlap adjacent exposure windows may facilitate fine resolution detection of the distance from the infrared camera 104 to the object 101 over a greater range of depth.

While various alternatives presented above (e.g., the duration of the light pulses 202, the duration of the openings of the exposure windows 204 and their delay from the light pulses 202, the number of infrared cameras 104 employed, the collection of photons over a single or multiple exposure window openings 204, and so on) are associated with particular embodiments exemplified in FIGS. 2A through 2E, such alternatives may be applied to other embodiments discussed in conjunction with FIGS. 2A through 2E, as well as to other embodiments described hereafter.

Figure 3:
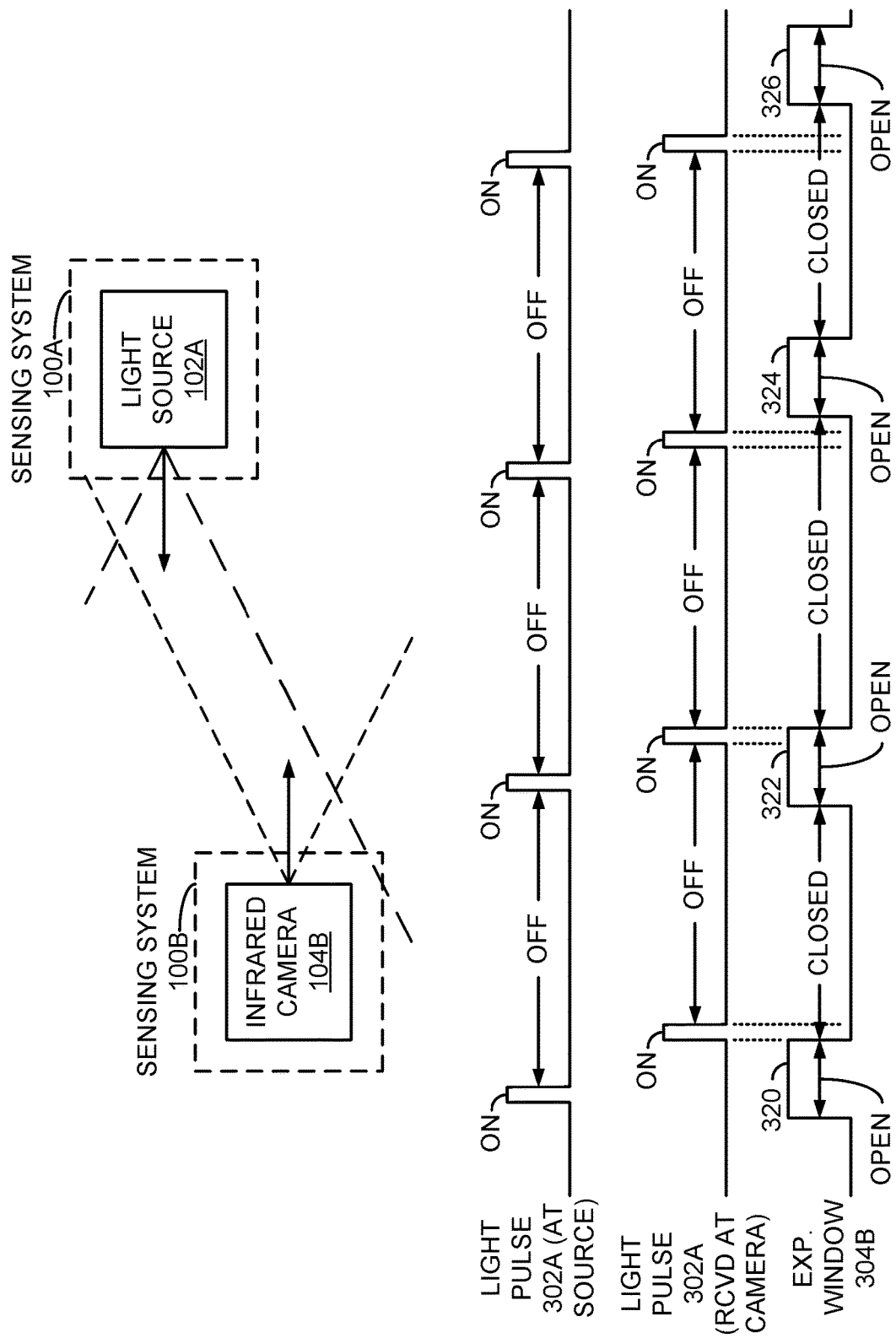
FIG. 3 is a timing diagram of light pulses of one sensing system compared to an exposure window for the infrared camera of FIG. 1 of a different sensing system in which pulse timing diversity is employed to mitigate intersystem interference.

FIG. 3 is a timing diagram of light pulses 302A of one sensing system 100A compared to an exposure window 304B for an infrared camera 104B of a different sensing system 100B in which pulse timing diversity is employed to mitigate intersystem interference. In one example, the sensing systems 100A and 100B may be located on separate vehicles, such as two automobiles approaching one another along a two-way street. Further, each of the sensing systems 100A and 100B of FIG. 3 includes an associated light source 102, an infrared camera 104, and a control circuit 110, as indicated in FIG. 1, but are not all explicitly shown therein to focus the following discussion. As depicted in FIG. 3, the light pulses 302A of a light source 102A of the first sensing system 100A, from time to time, may be captured during an exposure window 304B gating the infrared camera 104B of the second sensing system 100B, possibly leading the range determination circuit 116 of the second sensing system 100B to detect falsely the presence of an object 101 in a photon collection zone corresponding to the exposure window 304B. More specifically, the first opening 320 of the exposure window 304B, as shown in FIG. 3, does not collect light from the first light pulse 302A, but the second occurrence of the light pulse 302A is shown arriving at the infrared camera 104B during the second opening 322 of the exposure window 304B for the camera 104B. In one example, the range determination circuit 116 may determine that the number of photons collected at pixels of the infrared camera 104B while the exposure window 304B is open is too great to be caused by light reflected from an object 101, and may thus be received directly from a light source 102A that is not incorporated within the second sensing system 100B.

To address this potential interference, the sensing system 100B may dynamically alter the amount of time that elapses between at least two consecutive exposure window 304B openings (as well as between consecutive light pulses generated by a light source of the second sensing system 100B, not explicitly depicted in FIG. 3). For example, in the case of FIG. 3, the third opening 324 of the exposure window 304B has been delayed, resulting in the third light pulse 302A being received at the infrared camera 104B of the second sensing system 100B prior to the third opening 324 of the exposure window 304B. In this particular scenario, the exposure window timing circuit 114 of the second sensing system 100B has dynamically delayed the third opening 324 of the exposure window 304B in response to the range determination circuit 116 detecting a number of photons being collected during the second opening 322 of the exposure window 304B exceeding some threshold. Further, due to the delay between the second opening 322 and the third opening 324 of the exposure window 304B, the fourth opening 326 of the exposure window 304 is also delayed sufficiently to prevent collection of photons from the corresponding light pulse 302A from the light source 102A. In some examples, the amount of delay may be predetermined, or may be more randomized in nature.

In another embodiment, the exposure window timing circuit 114 of the second sensing system 100B may dynamically alter the timing between openings of the exposure window 304B automatically, possibly in some randomized manner. In addition, the exposure window timing circuit 114 may make these timing alterations without regard as to whether the range determination circuit 116 has detected collection of photons from the light source 102A. In some examples, the light source timing circuit 112 may alter the timing of the light pulses 302A from the light source 102A, again, possibly in some randomized fashion. In yet other implementations, any combination of these measures (e.g., altered timing of the light pulses 302A and/or the exposure window 304B, randomly and/or in response to photons captured directly instead of by reflection from an object 101, etc.) may be employed.

Additional ways of mitigating intersystem interference other than altering the exposure window timing may also be utilized. FIG. 4 is a graph of multiple wavelength channels 402 for the light source 102 of FIG. 1 to facilitate wavelength diversity. In one example, each sensing system 100 may be permanently assigned a particular wavelength channel 402 at which the light source 102A may operate to generate light pulses. In the particular implementation of FIG. 4, ten separate wavelength channels 402 are available that span a contiguous wavelength range from $\lambda 0$ to $\lambda 10$, although other numbers of wavelength channels 402 may be available in other examples. In other embodiments, the light source timing circuit 112 may dynamically select one of the wavelength channels 402. The selection may occur by way of activating one of several different light sources that constitute the light source 102 to provide light pulses at the selected wavelength channel 402. In other examples, the selection may occur by way of configuring a single light source 102 to emit light at the selected wavelength channel 402. In a particular implementation of FIG. 4, each wavelength channel 402 may possess a 5 nm bandwidth, with the ten channels collectively ranging from $\lambda 0=800$ nm to $\lambda 10=850$ nm. Other specific bandwidths, wavelengths, and number of wavelength channels 402 may be employed in other examples, including wavelength channels 402 that do not collectively span a contiguous wavelength range.

Correspondingly, the infrared camera 104 may be configured to detect light in the wavelength channel 402 at which its corresponding light source 102 is emitting. To that end, the infrared camera 104 may be configured permanently to detect light within the same wavelength channel 402 at which the light source 102 operates. In another example, the exposure window timing circuit 114 may be configured to operate the infrared camera 104 at the same wavelength channel 402 selected for the light source 102. Such a selection, for example, may activate a particular narrowband filter corresponding to the selected wavelength channel 402 so that light pulses at other wavelength channels 402 (e.g., light pulses from other sensing systems 100) are rejected.

Further, if the wavelength channel 402 to be used by the light source 102 and the infrared camera 104 may be selected dynamically, such selections may be made randomly over time and/or may be based on direct detection of light pulses from other sensing systems 100, as discussed above in conjunction with FIG. 3.

Figure 5A:
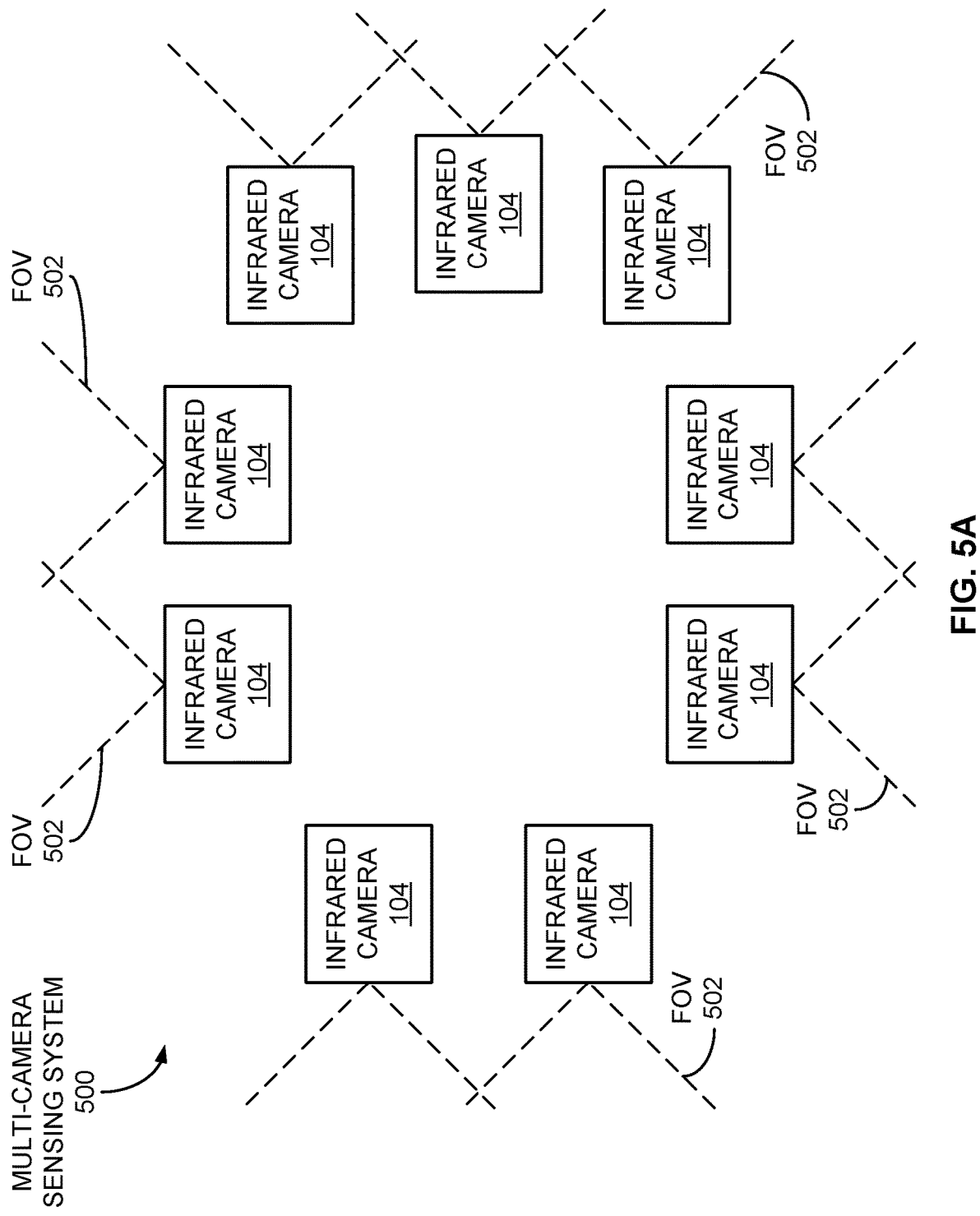
FIG. 5A is a block diagram of an example multiple-camera system to facilitate multiple fields of view.

FIG. 5A is a block diagram of an example multiple-camera sensing system 500 to facilitate multiple FOVs 502, which may allow the sensing of objects 101 at greater overall angles than what may be possible with a single infrared camera 104. In this example, nine different infrared cameras 104, each with its own FOV 502, are employed in a signal multi-camera sensing system 500, which may be employed at a single location, such as on a vehicle, thus providing nearly 360-degree coverage of the area about the location. The infrared cameras 104 may be used in conjunction with the same number of light sources 102, or with greater or fewer light sources. Further, the infrared cameras 104 may employ the same exposure window timing circuit 114, and may thus employ the same exposure window signals, or may be controlled by different exposure window timing circuits 114 that may each provide different exposure windows to each of the infrared cameras 114. In addition, the infrared cameras 104 may detect light within the same range of wavelengths, or light of different wavelength ranges. Other differences may distinguish the various infrared cameras of FIG. 5A as well.

Exhibiting how multiple infrared cameras 104 may be used in a different way, FIG. 5B is a block diagram of an example multiple-camera sensing system 501 to facilitate multiple depth zones for approximately the same FOV. In this particular example, a first infrared camera (e.g., infrared camera 104A) is used to detect objects 101 within a near-range zone 512, a second infrared camera (e.g., infrared camera 104B) is used to detect objects 101 within an intermediate-range zone 514, and a third infrared camera (e.g., infrared camera 104C) is used to detect objects 101 within a far-range zone 516. Each of the infrared cameras 104 may be operated using any of the examples described above, such as those described in FIGS. 2A through 2E, FIG. 3, and FIG. 4. Additionally, while the particular example of FIG. 5B defines the zones 512, 514, and 516 of FIG. 5B as non-overlapping, multiple infrared cameras 104 may be employed such that the zones 512, 514, and 516 corresponding to the infrared camera 104A, 104B, and 104C, respectively, may at least partially overlap, as was described above with respect to the embodiments of FIGS. 2B and 2E.

Figure 6:
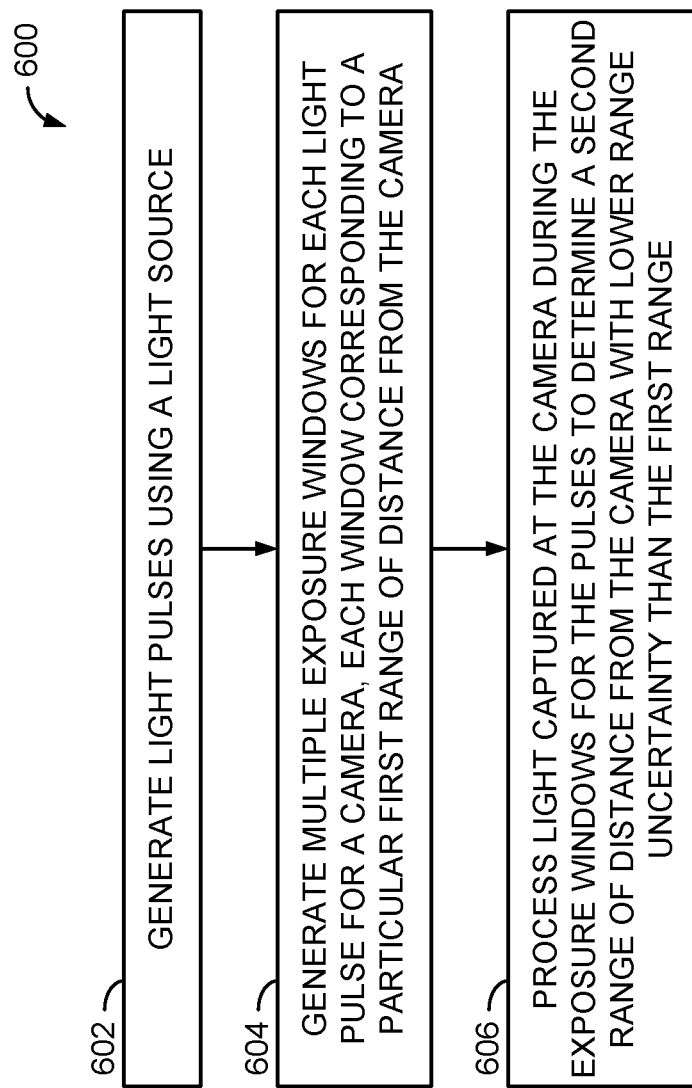
FIG. 6 is a flow diagram of an example method of using an infrared camera for fine resolution ranging.

FIG. 6 is a flow diagram of an example method 600 of using an infrared camera for fine resolution ranging. While the method is described below in conjunction with the infrared camera 104, the light source 102, the light source timing circuit 112, and the range determination circuit 116 of the sensing system 100 and variations disclosed above, other embodiments of the method 600 may employ different devices or systems not specifically discussed herein.

In the method 600, the light source timing circuit 112 generates light pulses using the light source 102 (operation 602). For each light pulse, the exposure window timing circuit 114 generates multiple exposure windows for the infrared camera 104 (operation 604). Each of the windows corresponds to a particular first range of distance from the infrared camera 104. These windows may overlap in time in some examples. The range determination circuit 116 may process the light captured at the infrared camera 104 during the exposure windows to determine a second range of distance from the camera with a lower range uncertainty than the first range of distance (operation 606), as described in multiple examples above.

While FIG. 6 depicts the operations 602-606 of the method 600 as being performed in a single particular order, the operations 602-606 may be performed repetitively over some period of time to provide an ongoing indication of the distance of objects 101 from the infrared camera 104, thus potentially tracking the objects 101 as they move from one depth zone to another.

Consequently, in at least some embodiments of the sensing system 100 and the method 600 described above, infrared cameras 104 may be employed not only to determine the lateral or spatial location of objects relative to some location, but to determine within some level of uncertainty the distance of that location from the infrared cameras 104.

Figure 7:
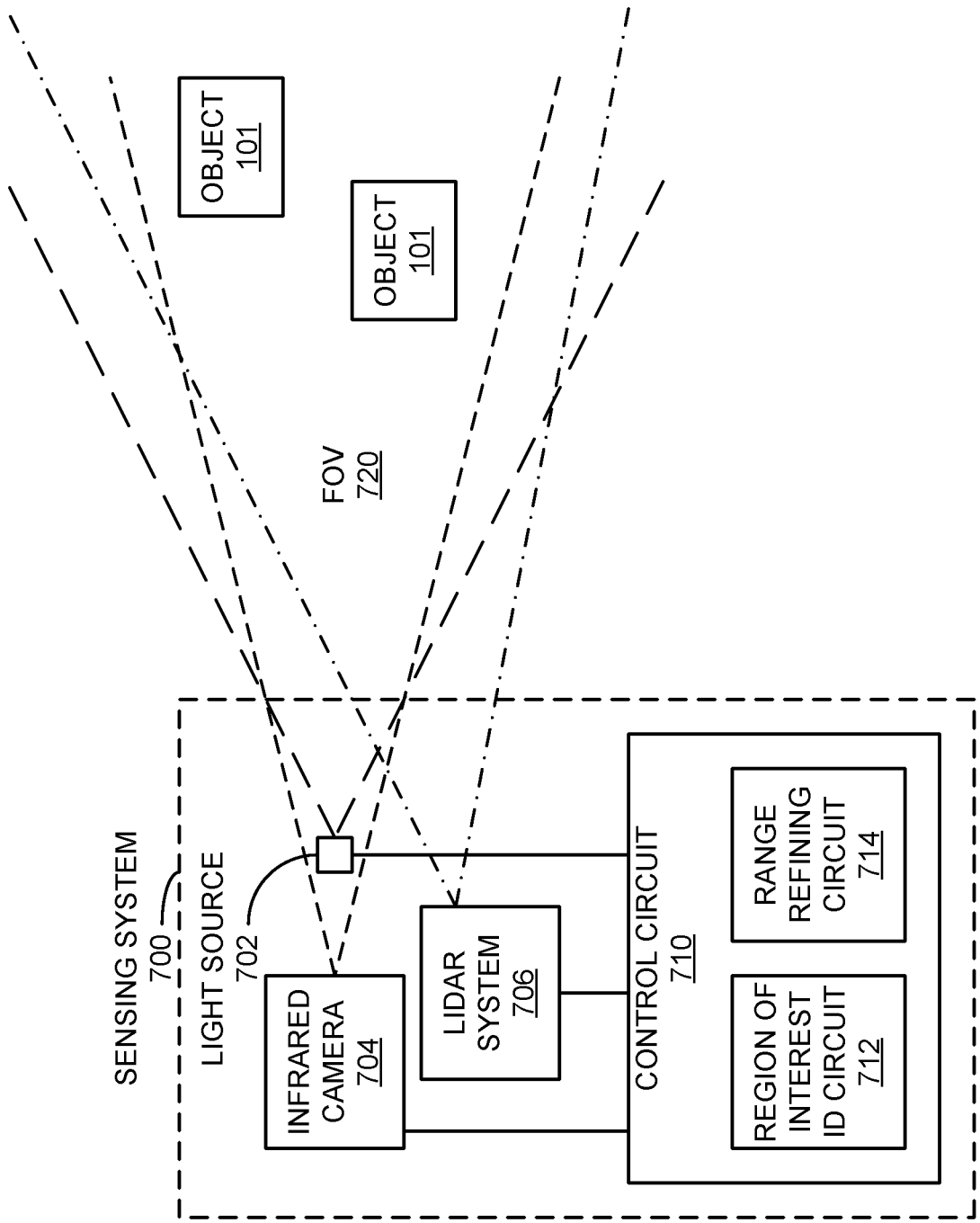
FIG. 7 is a block diagram of an example sensing system including an infrared camera operating in conjunction with a controllable light source, and including a light radar (lidar) system.

FIG. 7 is a block diagram of an example sensing system 700 including an infrared camera 704 operating in conjunction with a controllable light source 702, and a light radar (lidar) system 706. By operating the infrared camera 704 as described above with respect to the infrared camera 104 of FIG. 1 according to one of the various embodiments discussed earlier, and adding the use of the lidar system 706 in the sensing system 700, enhanced and efficient locating of objects 101 in three dimensions may result.

The sensing system 700, as illustrated in FIG. 7, includes the light source 702, the infrared camera 704, the lidar system 706, and a control circuit 710. More specifically, the control circuit 710 includes a region of interest (ROI) identifying circuit 712 and a range refining circuit 714. Each of the control circuit 710, the ROI identifying circuit 712, and the range refining circuit 714 may be implemented as hardware and/or software modules. The software modules may implement image recognition algorithms and/or deep neural networks (DNN) that have been trained to detect and identify objects of interest. In some examples, the ROI identifying circuit 712 may include the light source timing circuit 112, the exposure window timing circuit 114, and the range determination circuit 116 of FIG. 1, such that the light source 702 and the infrared camera 704 may be operated according to the embodiments discussed above to determine an ROI for each of the objects 101 detected within a FOV 720 of the infrared camera 704. In at least some embodiments, an ROI may be a three-dimensional (or two-dimensional) region within which each of the objects 101 is detected. In some examples further explained below, the ROI identifying circuit may employ the lidar system 706 in addition to the infrared camera 704 to determine the ROI of each object 101. The range refining circuit 714 may then utilize the lidar system 706 to probe each of the ROIs more specifically to determine or refine the range of distance of the objects 101 from the sensing system 700.

Figure 8A:
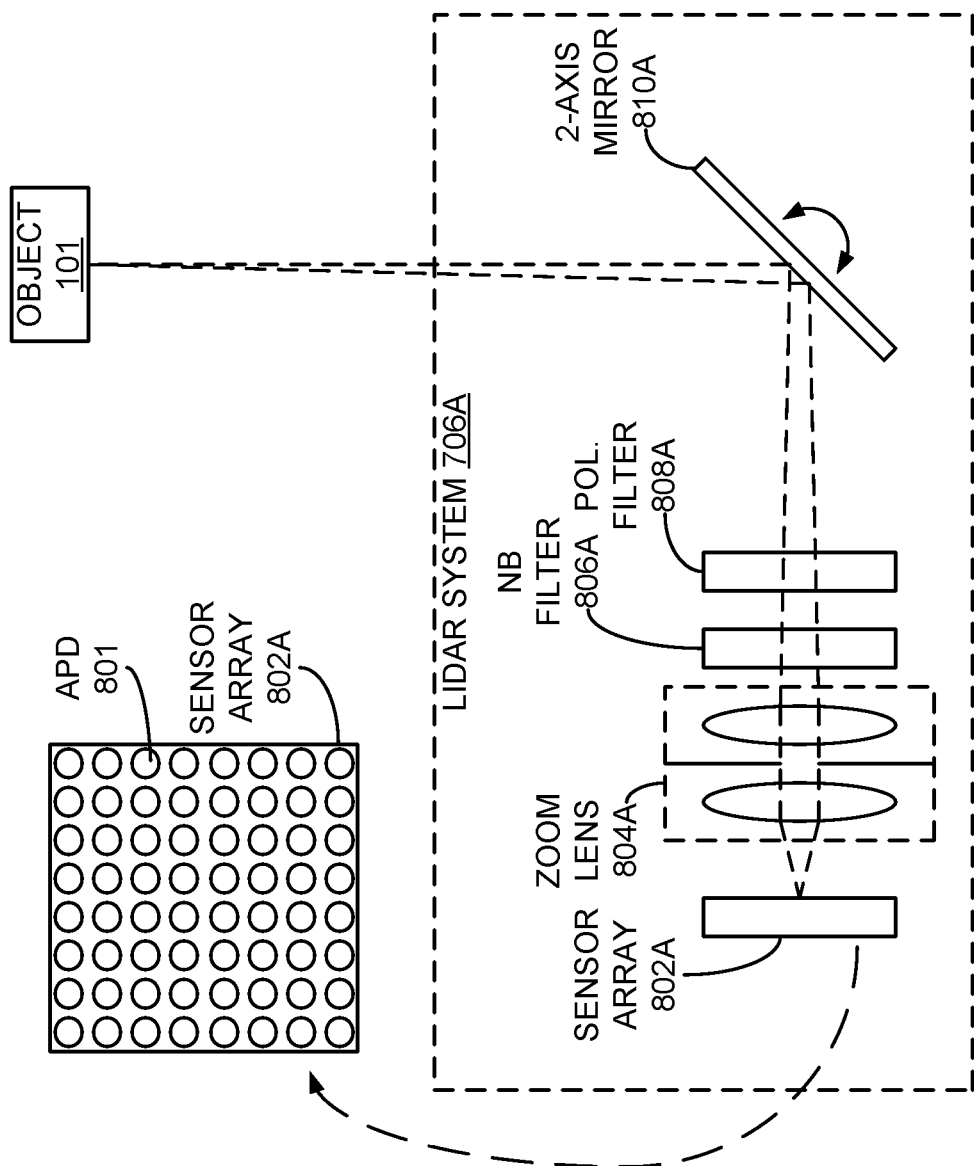
FIG. 8A is a block diagram of an example lidar system using a rotatable mirror.

In various embodiments of the sensing system 700, a "steerable" lidar system 706 that may be directed toward each of the identified ROIs is employed to probe each ROI individually. FIG. 8A is a block diagram of an example steerable lidar system 706A using a rotatable two-axis mirror 810A. As shown, the lidar system 706A includes a sensor array 802A, a zoom lens 804A, a narrow bandpass (NB) filter 806A, and possibly a polarizing filter 808A in addition to the two-axis mirror 810A. In addition, the steerable lidar system 706A may include its own light source (not shown in FIG. 8A), or may employ the light source 102 employed by the infrared camera 104 of FIG. 1 to illuminate the ROI to be probed. Other components may be included in the lidar system 706A, as well as in the lidar system of FIG. 8B described hereafter, but such components are not discussed in detail hereinafter.

Alternatively, the lidar system 706 may include non-steerable lidar that repetitively and uniformly scans the scene at an effective frame rate that may be less than that of the infrared camera 704. In this case, the lidar system 706 may provide high resolution depth measurements at a high spatial resolution for the selected ROIs while providing a more coarse spatial sampling of points across the rest of the FOV. By operating the lidar system 706 in this way, the light source 702 and the infrared camera 704 are primarily directed toward the ROIs. This alternative embodiment enables the use of uniform beam scanning hardware (e.g., polygon mirrors, resonant galvos, microelectromechanical systems (MEMS) mirrors) while reducing the overall light power and detection processing requirements.

The sensor array 802A may be configured, in one example, as a square, rectangular array, or linear array of avalanche photodiodes (APDs) or single photon avalanche diodes (SPAD) 801 elements. The particular sensor array 802A of FIG. 8A is an 8×8 array, although other array sizes and shapes, as well as other element types, may be used in other examples. The zoom lens 804A may be operated or adjusted (e.g., by the range refining circuit 714) to control how many of the APDs 801 capture light reflected from the object 101. For example, in a "zoomed in" position, the zoom lens 804 causes the object 101 to be detected using more of the APDs 801 than in a "zoomed out" position. In some examples, the zoom lens 804A may be configured or adjusted based on the size of the ROI being probed, with zoom lens 804A being configured to zoom in for smaller ROIs and to zoom out for larger ROIs. In other embodiments, the zoom lens 804A may be either zoomed in or out based on factors not related to the size of the ROI. Further, the zoom lens 804A may be telecentric, thus potentially providing the same magnification for objects 101 at varying distances from the lidar system 706A.

The NB filter 806A may be employed in some embodiments to filter out light at wavelengths that are not emitted from the particular light source being used to illuminate the object 101, thus reducing the amount of interference from other light sources that may disrupt a determination of the distance of the object 101 from the lidar system 706A. Also, the NB filter 806A may be switched out of the optical path of the lidar system 706A, and/or additional NB filters 806A may be employed so that the particular wavelengths being passed to the sensor array 802A may be changed dynamically. Similarly, the polarizing filter 808A may allow light of only a particular polarization that is optimized for the polarization of the light being used to illuminate the object 101. If employed in the lidar system 706A, the polarizing filter 808A may be switched dynamically out of the optical path of the lidar system 706A if, for example, unpolarized light is being used to illuminate the object 101.

The two-axis mirror 810A may be configured to rotate about both a vertical axis and a horizontal axis to direct light reflected from an object 101 in an identified ROI to the sensor array 802A via the filters 808A and 806A and the zoom lens 804A. More specifically, the two-axis mirror 810A may rotate about the vertical axis (as indicated by the double-headed arrow of FIG. 8A) to direct light from objects 101 at different horizontal locations to the sensor array 802A, and may rotate about the horizontal axis to direct light from objects 101 at different vertical locations.

Figure 8B:
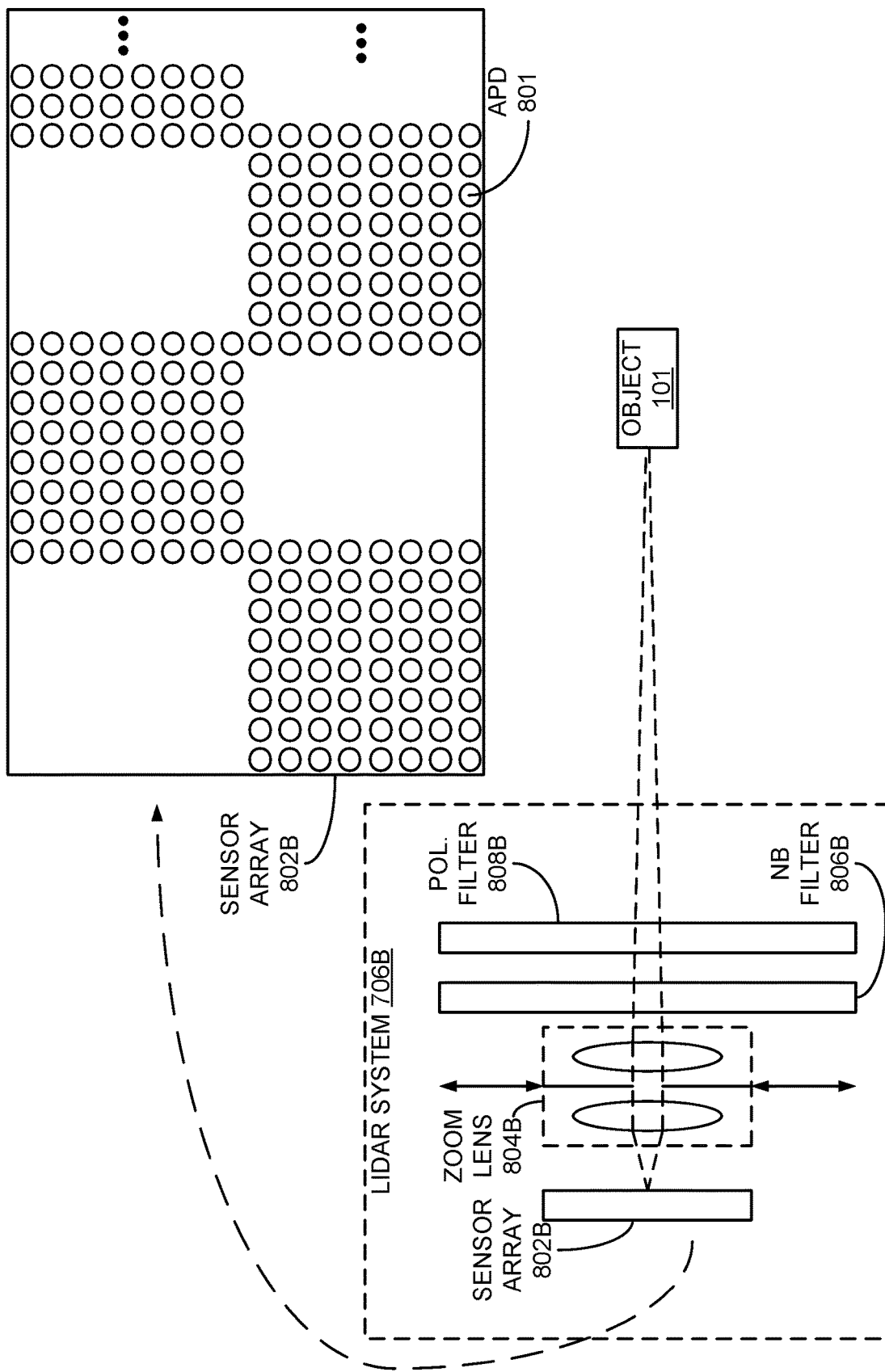
FIG. 8B is a block diagram of an example lidar system using a translatable lens.

FIG. 8B is a block diagram of another example steerable or non-steerable lidar system 706B using a translatable zoom lens 804A instead of a two-axis mirror. The steerable lidar system 706B also includes a sensor array 802B employing multiple APDs 801 or other light detection elements, as well as an NB filter 806B and possibly a polarizing filter 808B. In the specific example of FIG. 8B, the zoom lens 804B translates in a vertical direction to scan multiple horizontal swaths, one at a time, of the particular ROI being probed. To capture each swath, the particular sensor array 802B may employ two offset rows of smaller, spaced-apart 8×8 arrays. Moreover, some of the columns of APDs 801 between the upper row and the lower row of smaller arrays may overlap (as depicted in FIG. 8B), which may serve to reduce distortion of the resulting detected object 101 as the zoom lens 804B is translated up and down by allowing the range refining circuit 714 or another control circuit to mesh together information from each scan associated with each vertical position of the zoom lens 804B. However, while a particular configuration for the sensor array 802B is illustrated in FIG. 8B, many other configurations for the sensor array 802B may be utilized in other examples.

The NB filter 806B and the polarizing filter 808B may be configured in a manner similar to the NB filter 806A and the polarizing filter 808A of FIG. 8A described above. In one example, the NB filter 806B and the polarizing filter 808B may be sized and/or shaped such that they may remain stationary as the zoom lens 804B translates up and down in a vertical direction.

Each lidar system 706A and 706B of FIGS. 8A and 8B may be a flash lidar system, in which a single light pulse from the lidar system 706A and 706B is reflected from the object 101 back to all of the elements 801 of the sensor array 802A and 802B simultaneously. In such cases, the lidar system 706A and 706B may use the light source 102 (e.g., a VCSEL array) of the sensing system 100 of FIG. 1 to provide the light that is to be detected at the sensor array 802A and 802B. In other examples, the lidar system 706 of FIG. 7 may instead be a scanning lidar system, in which the lidar system 706 provides its own light source (e.g., a laser) that illuminate the object 101, with the reflected light being scanned over each element of the sensor array 802 individually in succession, such as by way of a small, relatively fast rotating mirror.

Figure 9:
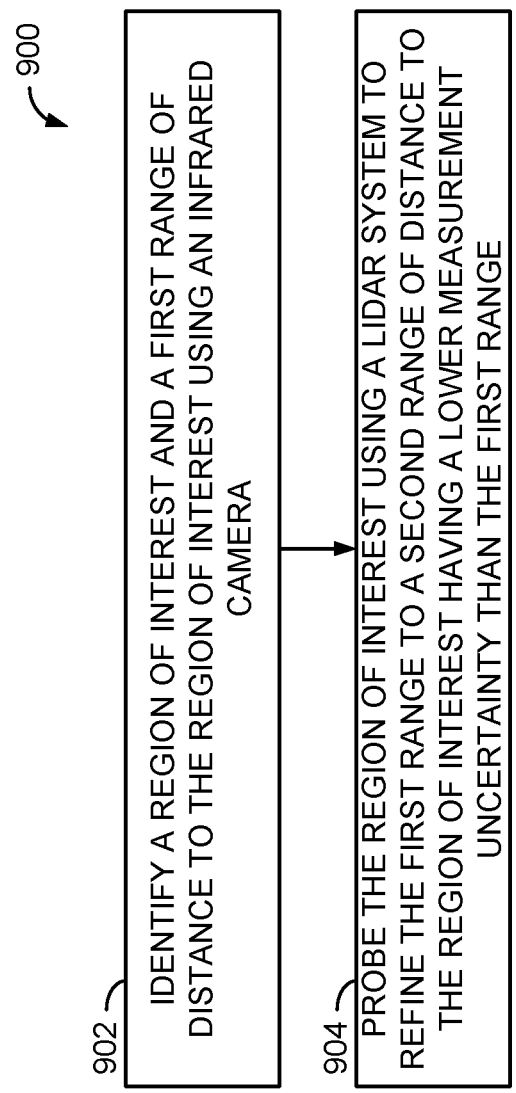
FIG. 9 is a flow diagram of an example method of employing an infrared camera and a lidar system for fine range resolution.

FIG. 9 is a flow diagram of an example method 900 of employing an infrared camera (e.g., the infrared camera 704 of FIG. 7) and a lidar system (e.g., the lidar system 706 of FIG. 7) for fine range resolution. In the method 900, an ROI and a first range of distance to the ROI is identified using the infrared camera (operation 902). This may be accomplished using image recognition algorithms or DNN that have been trained to detect and identify the objects of interest. The ROI is then probed using the lidar system to refine the first range to a second range of distance to the ROI having a lower measurement uncertainty (operation 904). Consequently in at least some embodiments, the sensing system 700 of FIG. 7 may employ the infrared camera 704 and the steerable lidar system 706 in combination to provide significant resolution regarding the location of objects both radially (e.g., in a z direction) and spatially, or laterally and vertically (e.g., in an x, y plane orthogonal to the z direction), beyond the individual capabilities of either the infrared camera 704 or the lidar system 706. More specifically, the infrared camera 704, which typically may facilitate high spatial resolution but less distance or depth resolution, is used to generate an ROI for each detected object in a particular scene. The steerable lidar system 706, which typically provides superior distance or radial resolution but less spatial resolution, may then probe each of these ROIs individually, as opposed to probing the entire scene in detail, to more accurately determine the distance to the object in the ROI with less range uncertainty.

Figure 10:
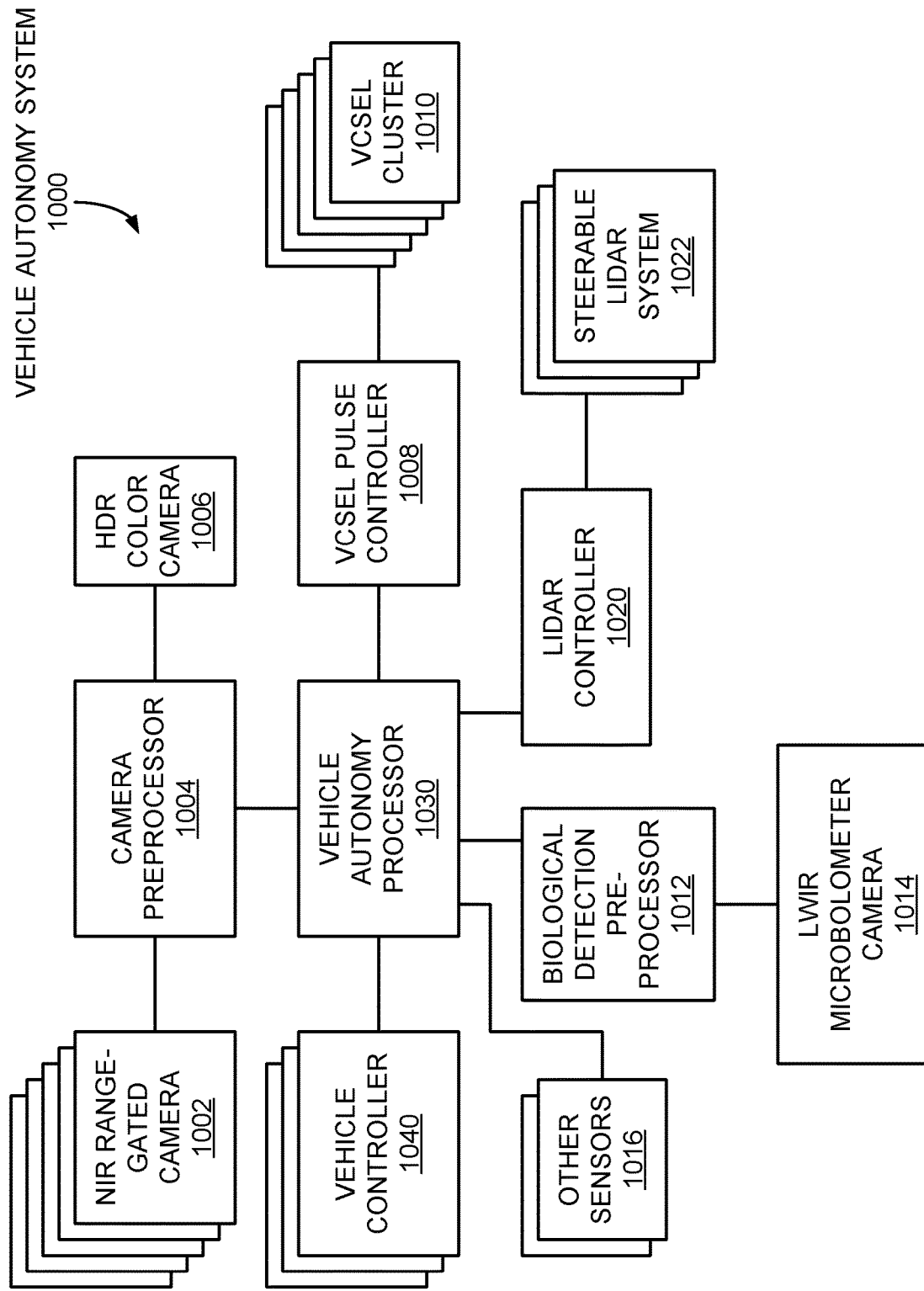
FIG. 10 is a block diagram of an example vehicle autonomy system in which infrared cameras, lidar systems, and other components may be employed.

Moreover, the inclusion of additional sensors or equipment in a system that utilizes an infrared camera and a steerable lidar system may further enhance the object sensing capabilities of the system. FIG. 10 is a block diagram of an example vehicle autonomy system 1000 in which near-infrared (NIR) range-gated cameras 1002 and steerable lidar systems 1022, in conjunction with other sensors and components may be employed to facilitate navigational control of a vehicle, such as, for example, an electrically-powered automobile.

As depicted in FIG. 10, the vehicle autonomy system 1000, in addition to NIR range-gated cameras 1002 and steerable lidar systems 1022, may include a high dynamic range (HDR) color camera 1006, a camera preprocessor 1004, VCSEL clusters 1010, a VCSEL pulse controller 1008, a lidar controller 1020, additional sensors 1016, a long-wave infrared (LWIR) microbolometer camera 1014, a biological detection preprocessor 1012, a vehicle autonomy processor 1030, and vehicle controllers 1040. Other components or devices may be incorporated in the vehicle autonomy system 1000, but are not discussed herein to simplify and focus the following discussion.

The VCSEL clusters 1010 may be positioned at various locations about the vehicle to illuminate the surrounding area with NIR light for use by the NIR range-gated cameras 1002, and possibly by the steerable lidar systems 1022, to detect objects (e.g., other vehicles, pedestrians, road and lane boundaries, road obstacles and hazards, warning signs, traffic signals, and so on). In one example, each VCSEL cluster 1010 may include several lasers providing light at wavelengths in the 800 to 900 nm range at a total cluster laser power of 2-4 W. Each cluster may be spaced at least 250 mm in some embodiments to meet reduced accessible emission levels. However, other types of light sources with different specifications may be employed in other embodiments. In at least some examples, the VCSEL clusters 1010 may serve as a light source (e.g., the light source 102 of FIG. 1), as explained above.

The VCSEL cluster pulse controller 1008 may be configured to receive pulse mode control commands and related information from the vehicle autonomy processor 1030 and drive or pulse the VCSEL clusters 1010 accordingly. In at least some embodiments, the VCSEL cluster pulse controller 1008 may serve as a light source timing circuit (e.g., the light source timing circuit 112 of FIG. 1), thus providing the various light pulsing modes for illumination, range-gating of the NIR range-gated cameras 1002, and the like, as discussed above.

The NIR range-gated cameras 1002 may be configured to identify ROIs using the various range-gating techniques facilitated by the opening and closing of the camera exposure window, thus potentially serving as an infrared camera (e.g., the infrared camera 104 of FIG. 1), as discussed earlier. In some examples, the NIR range-gated cameras 1002 may be positioned about the vehicle to facilitate FOV coverage about at least a majority of the environment of the vehicle. In one example, each NIR range-gated camera 1002 may be a high dynamic range (HDR) NIR camera including an array (e.g., a 2K×2K array) of imaging elements, as mentioned earlier, although other types of infrared cameras may be employed in the vehicle autonomy system 1000.

The camera preprocessor 1004 may be configured to open and close the exposure windows of each of the NIR range-gated cameras 1002, and thus may serve in some examples as an exposure window timing circuit (e.g., the exposure window timing circuit 114 of FIG. 1), as discussed above. In other examples, the camera preprocessor 1004 may receive commands from the vehicle autonomy processor 1030 indicating the desired exposure window timing, which may then operate the exposure windows accordingly. The camera preprocessor 1004 may also read or receive the resulting image element data (e.g., pixel voltages resulting from exposure of the image elements to light) and processing that data to determine the ROIs, including their approximate distance from the vehicle, associated with each object detected based on differences in light received at each image element, in a manner similar to that of the ROI identification circuit 712 of FIG. 7. The determination of an ROI may involve comparing the image data of the elements to some threshold level for a particular depth to determine whether an object has been detected within a particular collection zone, as discussed above. In some embodiments, the camera preprocessor 1004 may perform other image-related functions, possibly including, but not limited to, image segmentation (in which multiple objects, or multiple features of a single object, may be identified) and image fusion (in which information regarding an object detected in multiple images may be combined to yield more specific information describing that object).

In some examples, the camera preprocessor 1004 may also be communicatively coupled with the HDR color camera 1006 (or multiple such cameras) located on the vehicle. The HDR color camera 1006 may include a sensor array capable of detecting varying colors of light to distinguish various light sources in an overall scene, such as the color of traffic signals or signs within view. During low-light conditions, such as at night, dawn, and dusk, the exposure time of the HDR color camera 1006 may be reduced to prevent oversaturation or "blooming" of the sensor array imaging elements to more accurately identify the colors of bright light sources. Such a reduction in exposure time may be possible in at least some examples since the more accurate determination of the location of objects is within the purview of the NIR range-gated cameras 1002 and the steerable lidar systems 1022.

The camera preprocessor 1004 may also be configured to control the operation of the HDR color camera 1006, such as controlling the exposure of the sensor array imaging elements, as described above, possibly under the control of the vehicle autonomy processor 1030. In addition, the camera preprocessor 1004 may receive and process the resulting image data from the HDR color camera 1006 and forward the resulting processed image data to the vehicle autonomy processor 1030.

In some embodiments, the camera preprocessor 1004 may be configured to combine the processed image data from both the HDR color camera 1006 and the NIR range-gated cameras 1002, such as by way of image fusion and/or other techniques, to relate the various object ROIs detected using the NIR range-gated cameras 1002 with any particular colors detected at the HDR color camera 1006. Moreover, camera preprocessor 1004 may store consecutive images of the scene or environment surrounding the vehicle and perform scene differencing between those images to determine changes in location, color, and other aspects of the various objects being sensed or detected. As is discussed more fully below, the use of such information may help the vehicle autonomy system 1000 determine whether its current understanding of the various objects being detected remains valid, and if so, may reduce the overall data transmission bandwidth and sensor data processing that is to be performed by the vehicle autonomy processor 1030.

Each of the steerable lidar systems 1022 may be configured as a lidar system employing a two-axis mirror (e.g., the lidar system 706A of FIG. 8A), a lidar system employing a translatable lens (e.g., the lidar system 706B of FIG. 8B), or another type of steerable lidar system not specifically described herein. Similar to the lidar system 706 of FIG. 7, the steerable lidar systems 1022 may probe the ROIs identified by the NIR range-gated cameras 1002 and other components of the vehicle autonomy system 1000 under the control of the lidar controller 1020. In some examples, the lidar controller 1020 may provide functionality similar to the range refining circuit 714 of FIG. 7, as described above. Further, the lidar controller 1020, possibly in conjunction with the camera preprocessor 1004 and/or the vehicle autonomy processor 1030, may perform scene differencing using multiple scans, as described above, to track objects as they move through the scene or area around the vehicle. Alternatively, the lidar system may be the non-steerable lidar system described above that provides selective laser pulsing and detection processing.

The LWIR microbolometer camera 1014 may be a thermal (e.g., infrared) camera having a sensor array configured to detect, at each of its imaging elements, thermal radiation typically associated with humans and various animals. The biological detection preprocessor 1012 may be configured to control the operation of the LWIR microbolometer camera 1014, possibly in response to commands received from the vehicle autonomy processor 1030. Additionally, the biological detection preprocessor 1012 may process the image data received from the LWIR microbolometer camera 1014 to help identify whether any particular imaged objects in the scene are human or animal in nature, as well as possibly to specifically distinguish humans from other thermal sources, such as by way of intensity, size, and/or other characteristics.

Other sensors 1016 not specifically mentioned above may also be included in the vehicle autonomy system 1000. Such sensors 1016 may include, but are not limited to, radar systems and other sensors for additional object sensing or detection, as well as inertial measurement units (IMUs), which may provide acceleration, velocity, orientation, and other characteristics regarding the current position and movement of the vehicle. The other sensors 1016 may be controlled by the vehicle autonomy processor 1030 or another processor not explicitly indicated in FIG. 10, and the resulting sensor data may be provided to the vehicle autonomy processor 1030 or another processor for analysis in view of the data received from the NIR range-gated cameras 1002, the steerable lidar systems 1022, and other components of the vehicle autonomy system 1000. The other sensors 1016 may also include human input sensors, such as steering, acceleration, and braking input that may be provided by an occupant of the vehicle.

The vehicle autonomy processor 1030 may communicate directly or indirectly with the various cameras, sensors, controllers, and preprocessors, as discussed above, to determine the location, and possibly the direction and speed of movement, of the objects detected in the area around the vehicle. Based on this information, as well as on navigational information, speed limit data, and possibly other information, the vehicle autonomy processor 1030 may control the vehicle via the vehicle controllers 1040 to operate the motor, brakes, steering apparatus, and other aspects of the vehicle. The vehicle controllers 1040 may include, but are not limited to, an acceleration controller, a braking controller, a steering controller, and so on. Such control by the vehicle autonomy processor 1030 may be fully autonomous or semiautonomous (based at least partially on, for example, the human steering, acceleration, and braking input mentioned above).

The vehicle autonomy processor 1030, the camera preprocessor 1004, the lidar controller 1020, the VCSEL pulse controller 1008, the biological detection preprocessor 1012, or the vehicle controllers 1040 may include analog and/or digital electronic circuitry, and/or may include microcontrollers, DSPs, and/or other algorithmic processors configured to execute software or firmware instructions stored in a memory to perform the various functions ascribed to each of these components.

FIG. 11 is a flow diagram of an example method 1100 of operating a vehicle autonomy system, such as the vehicle autonomy system 1000 of FIG. 10. In at least some embodiments, the various operations of the method 1100 are executed and/or controlled by the vehicle autonomy processor 1030 working in conjunction with the various preprocessors and controllers, such as the camera preprocessor 1004, the lidar controller 1020, the VCSEL pulse controller 1008, and the biological detection preprocessor 1012. In the method 1100, input from sensors (e.g., the NIR range-gated cameras 1002 operating in range-gated mode, the HDR color camera 1006, the LWIR microbolometer camera 1014, and/or other sensors 1016, such as radars, IMUs, and the like) may be processed to identify ROIs in which objects may be located (operation 1102). In some examples, input from the steerable lidar systems 1022 operating in a "raster scanning" mode (e.g., scanning over the entire viewable scene or area, as opposed to focusing on a particular ROI) may also be used. In one embodiment, the camera image data and sensor data may be combined (e.g., by image fusion in some examples) to correlate detected images and their various aspects (e.g., area size, color, and/or so forth) to identify the ROIs.

The steerable lidar systems 1022 may then be operated to probe each of the identified ROIs (operation 1104), such as to more accurately determine a depth or distance of each corresponding object from the vehicle. To control the steerable lidar systems 1022 to perform the probing function, information describing each identified ROI, including, for example, spatial location, approximate distance, and size and/or shape data, may be processed to yield control information useful in operating the steerable lidar systems 1022 in probing each ROI. This control information may include, for example, lidar steering coordinates for each ROI, spatial sample size (e.g., width and height) for each ROI (useful for setting a zoom level for the lidar systems 1022 in at least some cases), scanning pattern for each ROI, and/or laser pulse repetition rates for the VCSEL clusters 1010 or dedicated light sources for the lidar systems 1022 so that the lidar systems 1022 may probe each ROI to yield the more specific distance information. In some embodiments, this information may be in the form of a range map and associated amplitudes of the light being reflected or returned.

Once such detailed location and other information has been obtained regarding each object, the vehicle autonomy processor 1030 and/or the lidar controller 1020 may continue to operate the steerable lidar systems 1022 to probe the various ROIs in conjunction with information that continues to be received from any or all of the NIR range-gated cameras 1002, the HDR color camera 1006, the LWIR microbolometer camera 1014, and the other sensors 1016. Using this input, the vehicle autonomy processor 1030, the camera preprocessor 1004, and/or the lidar controller 1020 track scene-to-scene differences. If the scene remains understandable and/or coherent to the vehicle autonomy system 1000 and/or other components of the vehicle autonomy system 1000 (operation 1108), the lidar controller 1020 may continue to operate the steerable lidar systems 1022 to probe each ROI (operation 1106). In such cases, the boundaries of the ROI may change over time as the object being tracked moves relative to the vehicle. Operating in this mode, in at least some examples, possibly alleviates the vehicle autonomy processor 1030, as well as the camera preprocessor 1004 and other components of the vehicle autonomy system 1000, from the processing associated with reacquiring each object and determining its associated ROI.

If, instead, the vehicle autonomy processor 1030 or another processor (e.g., the lidar controller 1020, the camera preprocessor 1004, and/or the biological detection preprocessor 1012) loses understanding of the scene (operation 1108), the vehicle autonomy processor 1030 may return the system back to an ROI identification mode (operation 1102), employing the NIR range-gated cameras, the steerable lidar systems 1022 in raster scanning mode, the HDR color camera 1006, the LWIR microbolometer camera 1014, and/or the other sensors 1016 to identify the current ROIs to be probed using the steerable lidar systems 1022 (operation 1104). In at least some examples, the vehicle autonomy system 1000 may lose understanding of the current scene in ways, such as, for example, losing track of an object that was recently located in the scene, an unexpected appearance of an object within the scene without being detected previously, an unexpected movement or change of direction of an object being tracked, other temporal inconsistencies and/or discrepancies between object positions and/or identities, and so on.

Based on the sensing of the objects in the area surrounding the vehicle, the vehicle autonomy processor 1030 may issue commands to the vehicle controllers 1040 to navigate the vehicle to avoid the detected objects (e.g., obstacles or hazards that may pose a risk), operate the vehicle according to detected warning signs and traffic signals, and so on.

Turning to FIG. 12, an electronic device 1200 including operational units 1202-1212 arranged to perform various operations of the presently disclosed technology is shown. The operational units 1202-1212 of the device 1200 may be implemented by hardware or a combination of hardware and software to carry out the principles of the present disclosure. It will be understood by persons of skill in the art that the operational units 1202-1212 described in FIG. 12 may be combined or separated into sub-blocks to implement the principles of the present disclosure. Therefore, the description herein supports any possible combination or separation or further definition of the operational units 1202-1212. Moreover, multiple electronic devices 1200 may be employed in various embodiments.

In one implementation, the electronic device 1200 includes an output unit 1202 configured to provide information, including possibly display information, such as by way of a graphical user interface, and a processing unit 1204 in communication with the output unit 1202 and an input unit 1206 configured to receive data from input devices or systems. Various operations described herein may be implemented by the processing unit 1204 using data received by the input unit 1206 to output information using the output unit 1202.

Additionally, in one implementation, the electronic device 1200 includes control units 1208 implementing the operations 602-606, 902-904, and 1102-1108 of FIGS. 6, 9, and 11. Accordingly, the control units 1208 may include or perform the operations associated with the control circuit 110 of FIG. 1, including the light source timing circuit 112, the exposure window timing circuit 114, and/or the range determination circuit 116, as well as the control circuit 710 of FIG. 7, including the ROI identification circuit 712 and/or the range refining circuit 714. Further, the electronic device 1200 may serve as any of the controllers and/or processors of FIG. 10, such as the camera preprocessor 1004, the VCSEL pulse controller 1008, the biological detection preprocessor 1012, the lidar controller 1020, the vehicle autonomy processor 1030, and/or the vehicle controllers 1040.

Referring to FIG. 13, a detailed description of an example computing system 1300 having computing units that may implement various systems and methods discussed herein is provided. The computing system 1300 may be applicable to, for example, the sensing systems 100, 500, 501, and/or 700, and similar systems described herein, as well as the vehicle autonomy system 1000, and various control circuits, controllers, processors, and the like described in connection thereto. It will be appreciated that specific implementations of these devices may be of differing possible specific computing architectures not all of which are specifically discussed herein but will be understood by those of ordinary skill in the art.

The computer system 1300 may be a computing system capable of executing a computer program product to execute a computer process. Data and program files may be input to the computer system 1300, which reads the files and executes the programs therein. Some of the elements of the computer system 1300 are shown in FIG. 13, including hardware processors 1302, data storage devices 1304, memory devices 1306, and/or ports 1308-1312. Additionally, other elements that will be recognized by those skilled in the art may be included in the computing system 1300 but are not explicitly depicted in FIG. 13 or discussed further herein. Various elements of the computer system 1300 may communicate with one another by way of communication buses, point-to-point communication paths, or other communication means not explicitly depicted in FIG. 13.

The processor 1302 may include, for example, a central processing unit (CPU), a microprocessor, a microcontroller, a digital signal processor (DSP), and/or internal levels of cache. There may be processors 1302, such that the processor 1302 comprises a single central-processing unit, or processing units capable of executing instructions and performing operations in parallel with each other, commonly referred to as a parallel processing environment.

The computer system 1300 may be a conventional computer, a distributed computer, or any other type of computer, such as external computers made available via a cloud computing architecture. The presently described technology is optionally implemented in software stored on the data storage device(s) 1304, stored on the memory device(s) 1306, and/or communicated via the ports 1308-1312, thereby transforming the computer system 1300 in FIG. 13 to a special purpose machine for implementing the operations described herein. Examples of the computer system 1300 include personal computers, terminals, workstations, mobile phones, tablets, laptops, personal computers, multimedia consoles, gaming consoles, set top boxes, embedded computing and processing systems, and the like.

The data storage devices 1304 may include any non-volatile data storage device capable of storing data generated or employed within the computing system 1300, such as computer executable instructions for performing a computer process, which may include instructions of both application programs and an operating system (OS) that manages the various components of the computing system 1300. The data storage devices 1304 may include, without limitation, magnetic disk drives, optical disk drives, solid state drives (SSDs), flash drives, and the like. The data storage devices 1304 may include removable data storage media, non-removable data storage media, and/or external storage devices made available via a wired or wireless network architecture with such computer program products, including database management products, web server products, application server products, and/or other additional software components. Examples of removable data storage media include Compact Disc Read-Only Memory (CD-ROM), Digital Versatile Disc Read-Only Memory (DVD-ROM), magneto-optical disks, flash drives, and the like. Examples of non-removable data storage media include internal magnetic hard disks, SSDs, and the like. The memory devices 1306 may include volatile memory (e.g., dynamic random access memory (DRAM), static random access memory (SRAM), etc.) and/or non-volatile memory (e.g., read-only memory (ROM), flash memory, etc.).

Computer program products containing mechanisms to effectuate the systems and methods in accordance with the presently described technology may reside in the data storage devices 1304 and/or the memory devices 1306, which may be referred to as machine-readable media. It will be appreciated that machine-readable media may include any tangible non-transitory medium that is capable of storing or encoding instructions to perform any of the operations of the present disclosure for execution by a machine or that is capable of storing or encoding data structures and/or modules utilized by or associated with such instructions. Machine-readable media may include a single medium or multiple media (e.g., a centralized or distributed database, and/or associated caches and servers) that store the executable instructions or data structures.

In some implementations, the computer system 1300 includes ports, such as an input/output (I/O) port 1308, a communication port 1310, and a sub-systems port 1312, for communicating with other computing, network, or vehicle devices. It will be appreciated that the ports 1308-1312 may be combined or separate and that more or fewer ports may be included in the computer system 1300.

The I/O port 1308 may be connected to an I/O device, or other device, by which information is input to or output from the computing system 1300. Such I/O devices may include, without limitation, input devices, output devices, and/or environment transducer devices.

In one implementation, the input devices convert a human-generated signal, such as, human voice, physical movement, physical touch or pressure, and/or the like, into electrical signals as input data into the computing system 1300 via the I/O port 1308. Similarly, the output devices may convert electrical signals received from computing system 1300 via the I/O port 1308 into signals that may be sensed as output by a human, such as sound, light, and/or touch. The input device may be an alphanumeric input device, including alphanumeric and other keys for communicating information and/or command selections to the processor 1302 via the I/O port 1308. The input device may be another type of user input device including, but not limited to: direction and selection control devices, such as a mouse, a trackball, cursor direction keys, a joystick, and/or a wheel; sensors, such as a camera, a microphone, a positional sensor, an orientation sensor, a gravitational sensor, an inertial sensor, and/or an accelerometer; and/or a touch-sensitive display screen ("touchscreen"). The output devices may include, without limitation, a display, a touchscreen, a speaker, a tactile and/or haptic output device, and/or the like. In some implementations, the input device and the output device may be the same device, for example, in the case of a touchscreen.

The environment transducer devices convert one form of energy or signal into another for input into or output from the computing system 1300 via the I/O port 1308. For example, an electrical signal generated within the computing system 1300 may be converted to another type of signal, and/or vice-versa. In one implementation, the environment transducer devices sense characteristics or aspects of an environment local to or remote from the computing device 1300, such as, light, sound, temperature, pressure, magnetic field, electric field, chemical properties, physical movement, orientation, acceleration, gravity, and/or the like. Further, the environment transducer devices may generate signals to impose some effect on the environment either local to or remote from the example computing device 1300, such as, physical movement of some object (e.g., a mechanical actuator), heating or cooling of a substance, adding a chemical substance, and/or the like.

In one implementation, a communication port 1310 is connected to a network by way of which the computer system 1300 may receive network data useful in executing the methods and systems set out herein as well as transmitting information and network configuration changes determined thereby. Stated differently, the communication port 1310 connects the computer system 1300 to communication interface devices configured to transmit and/or receive information between the computing system 1300 and other devices by way of wired or wireless communication networks or connections. Examples of such networks or connections include, without limitation, Universal Serial Bus (USB), Ethernet, Wi-Fi, Bluetooth®, Near Field Communication (NFC), Long-Term Evolution (LTE), and so on. Such communication interface devices may be utilized via the communication port 1310 to communicate other machines, either directly over a point-to-point communication path, over a wide area network (WAN) (e.g., the Internet), over a local area network (LAN), over a cellular (e.g., third generation (3G) or fourth generation (4G)) network, or over another communication means. Further, the communication port 1310 may communicate with an antenna for electromagnetic signal transmission and/or reception. In some examples, an antenna may be employed to receive Global Positioning System (GPS) data to facilitate determination of a location of a machine, vehicle, or another device.

The computer system 1300 may include a sub-systems port 1312 for communicating with systems related to a vehicle to control an operation of the vehicle and/or exchange information between the computer system 1300 and sub-systems of the vehicle. Examples of such sub-systems of a vehicle, include, without limitation, imaging systems, radar, lidar, motor controllers and systems, battery control, fuel cell or other energy storage systems or controls in the case of such vehicles with hybrid or electric motor systems, autonomous or semi-autonomous processors and controllers, steering systems, brake systems, light systems, navigation systems, environment controls, entertainment systems, and the like.

In an example implementation, object sensing information and software and other modules and services may be embodied by instructions stored on the data storage devices 1304 and/or the memory devices 1306 and executed by the processor 1302. The computer system 1300 may be integrated with or otherwise form part of a vehicle. In some instances, the computer system 1300 is a portable device that may be in communication and working in conjunction with various systems or sub-systems of a vehicle.

The present disclosure recognizes that the use of such information may be used to the benefit of users. For example, the sensing information of a vehicle may be employed to provide directional, acceleration, braking, and/or navigation information, as discussed above. Accordingly, use of such information enables calculated control of an autonomous vehicle. Further, other uses for location information that benefit a user of the vehicle are also contemplated by the present disclosure.

Users can selectively block use of, or access to, personal data, such as location information. A system incorporating some or all of the technologies described herein can include hardware and/or software that prevents or blocks access to such personal data. For example, the system can allow users to "opt in" or "opt out" of participation in the collection of personal data or portions thereof. Also, users can select not to provide location information, or permit provision of general location information (e.g., a geographic region or zone), but not precise location information.

Entities responsible for the collection, analysis, disclosure, transfer, storage, or other use of such personal data should comply with established privacy policies and/or practices. Such entities should safeguard and secure access to such personal data and ensure that others with access to the personal data also comply. Such entities should implement privacy policies and practices that meet or exceed industry or governmental requirements for maintaining the privacy and security of personal data. For example, an entity should collect users' personal data for legitimate and reasonable uses and not share or sell the data outside of those legitimate uses. Such collection should occur only after receiving the users' informed consent. Furthermore, third parties can evaluate these entities to certify their adherence to established privacy policies and practices.

The system set forth in FIG. 13 is but one possible example of a computer system that may employ or be configured in accordance with aspects of the present disclosure. It will be appreciated that other non-transitory tangible computer-readable storage media storing computer-executable instructions for implementing the presently disclosed technology on a computing system may be utilized.

In the present disclosure, the methods disclosed may be implemented as sets of instructions or software readable by a device. Further, it is understood that the specific order or hierarchy of steps in the methods disclosed are instances of example approaches. Based upon design preferences, it is understood that the specific order or hierarchy of steps in the method can be rearranged while remaining within the disclosed subject matter. The accompanying method claims present elements of the various steps in a sample order, and are not necessarily meant to be limited to the specific order or hierarchy presented.

The described disclosure may be provided as a computer program product, or software, that may include a non-transitory machine-readable medium having stored thereon instructions, which may be used to program a computer system (or other electronic devices) to perform a process according to the present disclosure. A machine-readable medium includes any mechanism for storing information in a form (e.g., software, processing application) readable by a machine (e.g., a computer). The machine-readable medium may include, but is not limited to, magnetic storage medium, optical storage medium; magneto-optical storage medium; read only memory (ROM); random access memory (RAM); erasable programmable memory (e.g., EPROM and EEPROM); flash memory; or other types of medium suitable for storing electronic instructions.

While the present disclosure has been described with reference to various implementations, it will be understood that these implementations are illustrative and that the scope of the disclosure is not so limited. Many variations, modifications, additions, and improvements are possible. More generally, implementations in accordance with the present disclosure have been described in the context of particular implementations. Functionality may be separated or combined in blocks differently in various embodiments of the disclosure or described with different terminology. These and other variations, modifications, additions, and improvements may fall within the scope of the disclosure as defined in the claims that follow.

What is claimed is:

1. A system for sensing objects, the system comprising:
a light source;
a camera;
a light source timing circuit to generate light pulses using the light source;
an exposure window timing circuit to generate multiple exposure windows for the light pulses for the camera, each of the multiple exposure windows representing a corresponding first range of distance from the camera, the exposure window timing circuit generating a signal to control an opening and a closing of a camera exposure window of the camera according to the multiple exposure windows, each exposure window of the multiple exposure windows having a delayed opening for a period of time following a corresponding light pulse of the light pulses being emitted, the period of time being associated with a photon collection zone within a field of view of the camera, each exposure window opening at a first time corresponding to a first edge of the photon collection zone and closing at a second time corresponding to a second edge of the photon collection zone, the first edge being adjacent to a near-range blanking region and the second edge being adjacent to a far-range blanking region; and
a range determination circuit to process an indication of an amount of light captured at the camera during the opening of the camera exposure window for each of the multiple exposure windows to determine a presence of at least one object within a second range of distance from the camera, the second range having lower uncertainty than the first range.

2. The system of claim 1, wherein:
the camera comprises a first camera;
the multiple exposure windows comprising first multiple exposure windows for a first field of view (FOV) corresponding to the first camera;
the system further comprises a second camera;
the exposure window timing circuit to generate, for each light pulse for the second camera, multiple second exposure windows for a second FOV corresponding to the second camera, each of the second multiple exposure windows representing a corresponding first range of distance from the second camera the exposure window timing circuit generating a signal to control an opening and a closing of a second camera exposure window of the camera according to the multiple second exposure windows; and
the range determination circuit to process an indication of an amount of light captured at the second camera during an opening of the second camera exposure window of each of the second multiple exposure windows for one of the light pulses to determine the presence of the at least one object with a second range of distance from the second camera, the second range from the second camera having lower uncertainty than the first range from the second camera.

3. The system of claim 1, further comprising.
a light radar (lidar) system; and
a region of interest identification circuit to identify a region of interest within the second range using the camera and the light source; and
a range refining circuit to probe the region of interest to refine the second range to a third range of distance to the region of interest using the lidar system, the third range having lower uncertainty than the second range.

4. A method for sensing objects, the method comprising:
generating, by a processor, an illumination of a light source;
generating, by the processor, multiple exposure windows for the illumination of the light source for a camera, each of the multiple exposure windows representing a corresponding first range of distance from the camera, the multiple exposure windows having a first exposure window and a second exposure window, a relationship between the first exposure window and the second exposure window being such that a first photon collection zone and a second photon collection zone are created, both the first photon collection zone and the second photon collection zone located between a near-range blanking region and a far-range blanking region within a field of view of the camera;
controlling an opening and a closing of a camera exposure window of the camera according to the multiple exposure windows; and
processing, by the processor, an indication of an amount of light captured at the camera during the opening of the camera exposure window for each of the multiple exposure windows for the illumination of the light source to determine a presence of an object within a second range of distance from the camera, the second range having a lower uncertainty than the first range.

5. The method of claim 4, wherein the light source comprises a vertical-cavity surface-emitting laser (VCSEL) array.

6. The method of claim 4, wherein:
the light source comprises a near-infrared (NIR) light source; and
the camera comprises an NIR camera.

7. The method of claim 4, wherein the relationship between the first exposure window and the second exposure window includes the first exposure window being adjacent to and non-overlapping with the second exposure window, the first photon collection zone being created adjacent to the second photon collection zone.

8. The method of claim 7, wherein the second range is determined based on a first amount of light captured for the first exposure window and a second amount of light captured for the second exposure window.

9. The method of claim 4, wherein the relationship between the first exposure window and the second exposure window includes the first exposure window overlapping with the second exposure window, the first photon collection zone being created overlapping with the second photon collection zone.

10. The method of claim 9, wherein the second range is determined based on a first amount of light captured for the first exposure window and a second amount of light captured for the second exposure window.

11. The method of claim 9, wherein an increase in an amount of overlap of the first exposure window with the second exposure window increases a depth resolution for determining the second range.

12. A method for sensing objects, the method comprising:
generating an illumination of a light source;
generating a first exposure window for the illumination of the light source, the first exposure window being one of multiple exposure windows for a camera, the first exposure window corresponding to a first range of distance from the camera, a first photon collection zone within a field of view of the camera being created based on the first exposure window, the first photon collection zone being located between a near-range blanking region and a far-range blanking region;
controlling an opening of a camera exposure window of the camera according to the first exposure window;
capturing an amount of light returning from the illumination of the light source at the camera during the camera exposure window for the first exposure window;
determining a second range of distance from the camera in which an object is present based on the amount of light captured at the camera, the second range having lower uncertainty than the first range.

13. The method of claim 12, wherein the first range of distance is an outer range of distance from the camera and the multiple exposure windows includes a second exposure window, the second exposure window corresponding to an inner range of distance from the camera, the second exposure window opening at a same time as the first exposure window and closing prior to the first exposure window closes, the second range determined by the amount of light captured for the first exposure window and a second amount of light captured for the second exposure window.

14. The method of claim 12, wherein the first exposure window has a delayed opening for a period of time following the illumination of the light source, the period of time being associated with the first photon collection zone, the first exposure window opening at a first time corresponding to a first edge of the first photon collection zone and closing at a second time corresponding to a second edge of the first photon collection zone, the first edge being adjacent to the near-range blanking region and the second edge being adjacent to the far-range blanking region.

15. The method of claim 12, wherein the first exposure window is adjacent to and non-overlapping with a second exposure window of the multiple exposure windows, such that the first photon collection zone is created adjacent to a second photon collection zone, both the first photon collection zone and the second photon collection zone located between the near-range blanking region and the far-range blanking region within the field of view of the camera, the second range determined based on the amount of light captured for the first exposure window and a second amount of light captured for the second exposure window.

16. The method of claim 12, wherein the first exposure window is overlapping with a second exposure window of the multiple exposure windows, such that the first photon collection zone is created overlapping with a second photon collection zone, both the first photon collection zone and the second photon collection zone located between the near-range blanking region and the far-range blanking region within the field of view of the camera, the second range determined based on the amount of light captured for the first exposure window and a second amount of light captured for the second exposure window.

17. The method of claim 16, wherein an increase in an amount of overlap of the first exposure window with the second exposure window increases depth resolution for determining the second range.

18. The method of claim 12, wherein the light source comprises a near-infrared (NIR) light source, and the camera comprises an NIR camera.

19. A system for sensing objects, the system comprising:
a light source configured to illuminate a field of view;
a camera, an opening and a closing of a camera exposure window configured to be controlled according to multiple exposure windows for an illumination of the light source, each of the multiple exposure windows representing a corresponding first range of distance from the camera, the multiple exposure windows having a first exposure window and a second exposure window, a relationship between the first exposure window and the second exposure window being such that a first photon collection zone and a second photon collection zone are created, both the first photon collection zone and the second photon collection zone located between a near-range blanking region and a far-range blanking region within the field of view; and
a processor processing an indication of an amount of light captured at the camera during the opening of the camera exposure window for each of the multiple exposure windows for the illumination of the light source to determine a presence of an object within a second range of distance from the camera, the second range having a lower uncertainty than the first range.

20. The system of claim 19, wherein the relationship between the first exposure window and the second exposure window includes at least one of: the first exposure window being adjacent to and non-overlapping with the second exposure window, the first photon collection zone being created adjacent to the second photon collection zone; or the first exposure window overlapping with the second exposure window, the first photon collection zone being created overlapping with the second photon collection zone.

21. A system for sensing objects, the system comprising:
a light source configured to illuminate a field of view; and
a camera, an opening of a camera exposure window configured to be controlled according to a first exposure window for an illumination of the light source, the first exposure window being one of multiple exposure windows for the camera, the first exposure window corresponding to a first range of distance from the camera, a first photon collection zone within the field of view being created based on the first exposure window, the first photon collection zone being located between a near-range blanking region and a far-range blanking region, an amount of light returning from the illumination of the light source being captured at the camera during the camera exposure window for the first exposure window, a second range of distance from the camera in which an object is present being determined based on the amount of light captured at the camera, the second range having lower uncertainty than the first range.

22. The system of claim 21, wherein the first exposure window is at least one of:
delayed through a delayed opening for a period of time following the illumination of the light source, the period of time being associated with the first photon collection zone, the first exposure window opening at a first time corresponding to a first edge of the first photon collection zone and closing at a second time corresponding to a second edge of the first photon collection zone, the first edge being adjacent to the near-range blanking region and the second edge being adjacent to the far-range blanking region;
adjacent to and non-overlapping with a second exposure window of the multiple exposure windows, such that the first photon collection zone is created adjacent to a second photon collection zone, both the first photon collection zone and the second photon collection zone located between the near-range blanking region and the far-range blanking region within the field of view of the camera, the second range determined based on the amount of light captured for the first exposure window and a second amount of light captured for the second exposure window; or
overlapping with a second exposure window of the multiple exposure windows, such that the first photon collection zone is created overlapping with a second photon collection zone, both the first photon collection zone and the second photon collection zone located between the near-range blanking region and the far-range blanking region within the field of view of the camera, the second range determined based on the amount of light captured for the first exposure window and a second amount of light captured for the second exposure window.

* * * * *